(12) United States Patent
Liu et al.

(10) Patent No.: US 11,978,634 B2
(45) Date of Patent: May 7, 2024

(54) REDUCE WELL DOPANT LOSS IN FINFETS THROUGH CO-IMPLANTATION

(71) Applicant: Taiwan Semiconductor Manufacturing Co., Ltd., Hsinchu (TW)

(72) Inventors: Sih-Jie Liu, Hsinchu (TW); Chun-Feng Nieh, Hsinchu (TW); Huicheng Chang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/664,930

(22) Filed: May 25, 2022

(65) Prior Publication Data

US 2022/0301874 A1    Sep. 22, 2022

Related U.S. Application Data

(63) Continuation of application No. 17/181,665, filed on Feb. 22, 2021, now Pat. No. 11,348,792, which is a
(Continued)

(51) Int. Cl.
*H01L 21/265*    (2006.01)
*H01L 21/266*    (2006.01)
(Continued)

(52) U.S. Cl.
CPC .. *H01L 21/26513* (2013.01); *H01L 21/26586* (2013.01); *H01L 21/266* (2013.01);
(Continued)

(58) Field of Classification Search
CPC ......... H01L 21/26513; H01L 21/26586; H01L 21/266; H01L 21/28; H01L 21/823821; H01L 21/823892; H10B 10/12
(Continued)

(56) References Cited

U.S. PATENT DOCUMENTS 5,795,803 A    8/1998    Takamura et al.
9,082,698 B1    7/2015    Joshi et al.
(Continued)

FOREIGN PATENT DOCUMENTS

CN    106449405 A    2/2017
JP    2014038898 A    2/2014
(Continued)

*Primary Examiner* — Thinh T Nguyen
(74) *Attorney, Agent, or Firm* — Slater Matsil, LLP

(57) ABSTRACT

A method of forming a semiconductor device includes performing a first implantation process on a semiconductor substrate to form a deep p-well region, performing a second implantation process on the semiconductor substrate with a diffusion-retarding element to form a co-implantation region, and performing a third implantation process on the semiconductor substrate to form a shallow p-well region over the deep p-well region. The co-implantation region is spaced apart from a top surface of the semiconductor substrate by a portion of the shallow p-well region, and the dee p-well region and the shallow p-well region are joined with each other. An n-type Fin Field-Effect Transistor (FinFET) is formed, with the deep p-well region and the shallow p-well region acting as a well region of the n-type FinFET.

20 Claims, 20 Drawing Sheets

Related U.S. Application Data continuation of application No. 16/559,042, filed on Sep. 3, 2019, now Pat. No. 10,930,507.

(60) Provisional application No. 62/753,150, filed on Oct. 31, 2018.

(51) Int. Cl.
| | | |
|---|---|---|
| *H01L 21/28* | (2006.01) | |
| *H01L 21/8238* | (2006.01) | |
| *H01L 27/092* | (2006.01) | |
| *H01L 29/66* | (2006.01) | |
| *H01L 29/78* | (2006.01) | |
| *H10B 10/00* | (2023.01) | |

(52) U.S. Cl.
CPC ...... *H01L 21/28* (2013.01); *H01L 21/823821* (2013.01); *H01L 21/823892* (2013.01); *H01L 27/0921* (2013.01); *H01L 27/0924* (2013.01); *H01L 29/66795* (2013.01); *H01L 29/7851* (2013.01); *H10B 10/12* (2023.02)

(58) Field of Classification Search
USPC .................. 257/420, 401; 438/284, 286
See application file for complete search history.

(56) References Cited

U.S. PATENT DOCUMENTS

| | | |
|---|---|---|
| 9,484,409 B2 | 11/2016 | Lee et al. |
| 2008/0023732 A1 | 1/2008 | Felch et al. |
| 2014/0027818 A1 | 1/2014 | Asenov |
| 2016/0111537 A1 | 4/2016 | Tsai et al. |
| 2019/0393040 A1* | 12/2019 | Chen et al. ..... H01L 21/021115 |

FOREIGN PATENT DOCUMENTS

| | | |
|---|---|---|
| KR | 100231765 B1 | 11/1999 |
| KR | 20060077691 A | 7/2006 |
| KR | 20160058307 A | 5/2016 |
| TW | 201545213 A | 12/2015 |

* cited by examiner

REDUCE WELL DOPANT LOSS IN FINFETS THROUGH CO-IMPLANTATION

PRIORITY CLAIM AND CROSS-REFERENCE

This application is a continuation of U.S. patent application Ser. No. 17/181,665, entitled "Reduce Well Dopant Loss in FinFETs Through Co-Implantation," filed Feb. 22, 2021, which is a continuation of U.S. patent application Ser. No. 16/559,042, entitled "Reduce Well Dopant Loss in FinFETs Through Co-Implantation," filed Sep. 3, 2019, now U.S. Pat. No. 10,930,507 issued Feb. 23, 2021, which claims the benefit of the U.S. Provisional Application No. 62/753,150, filed Oct. 31, 2018, and entitled "Reduce Well Dopant Loss in FinFETs through Co-Implantation," which applications are hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
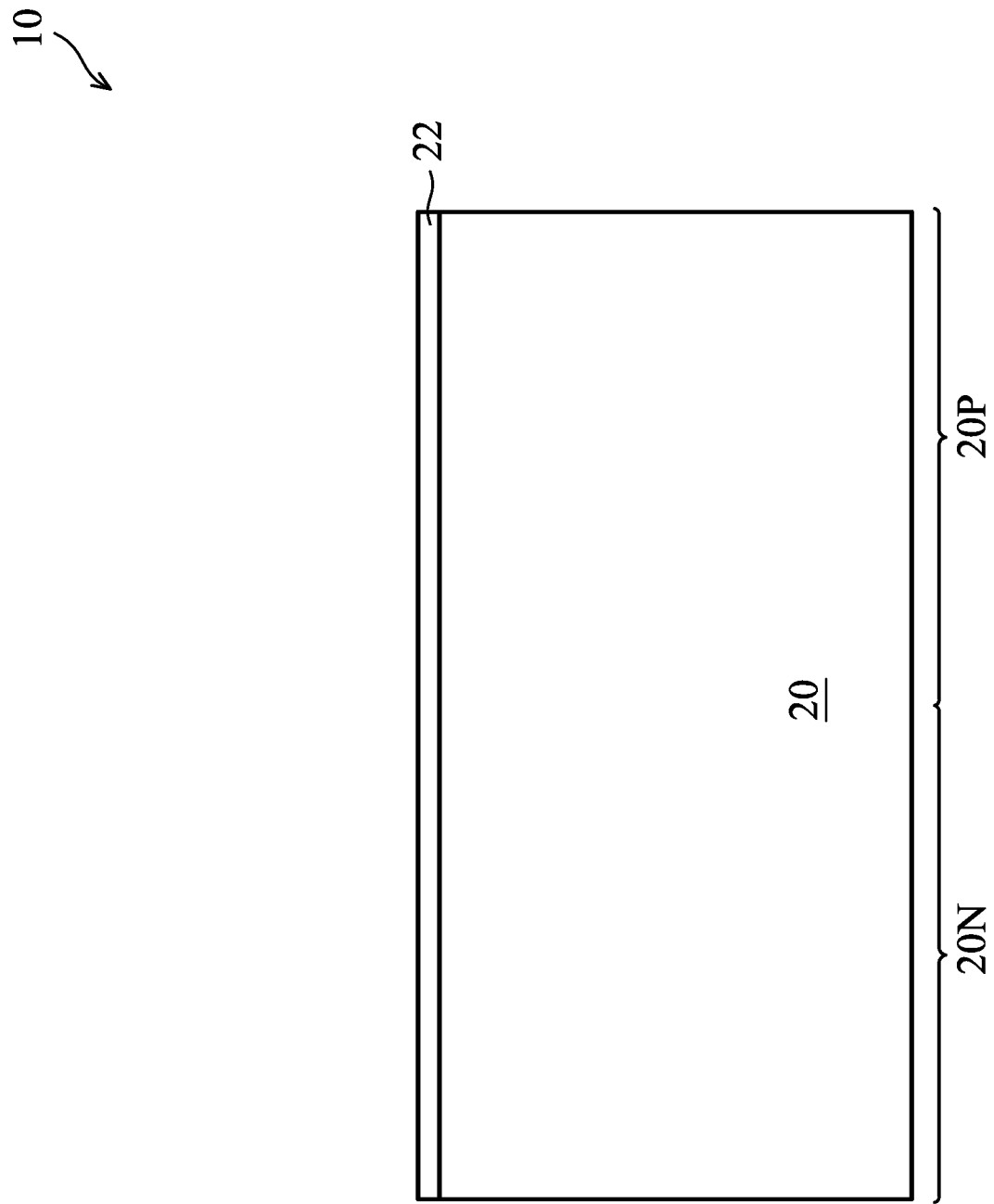
FIGS. 1 through 15 illustrate the cross-sectional views and perspective views of intermediate stages in the formation of well regions and transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Well regions and transistors and the method of forming the same are provided in accordance with various embodiments. The intermediate stages of forming the well regions and transistors are illustrated in accordance with some embodiments. Some variations of some embodiments are discussed. Throughout the various views and illustrative embodiments, like reference numbers are used to designate like elements.

In accordance with some embodiments of the present disclosure, the well regions that are used for forming transistors are co-implanted with carbon to appropriate depths in order to prevent dopant loss. In addition, p-well regions may be selectively co-implanted without co-implanting n-well regions. It is appreciated that the formation of Fin Field-Effect Transistors (FinFETs) are used as examples to explain the concept of the present disclosure. The embodiments are readily applicable to the formation of other types of transistors such as planar transistors, Gate All Around (GAA) transistors, or the like.

Figure 20:
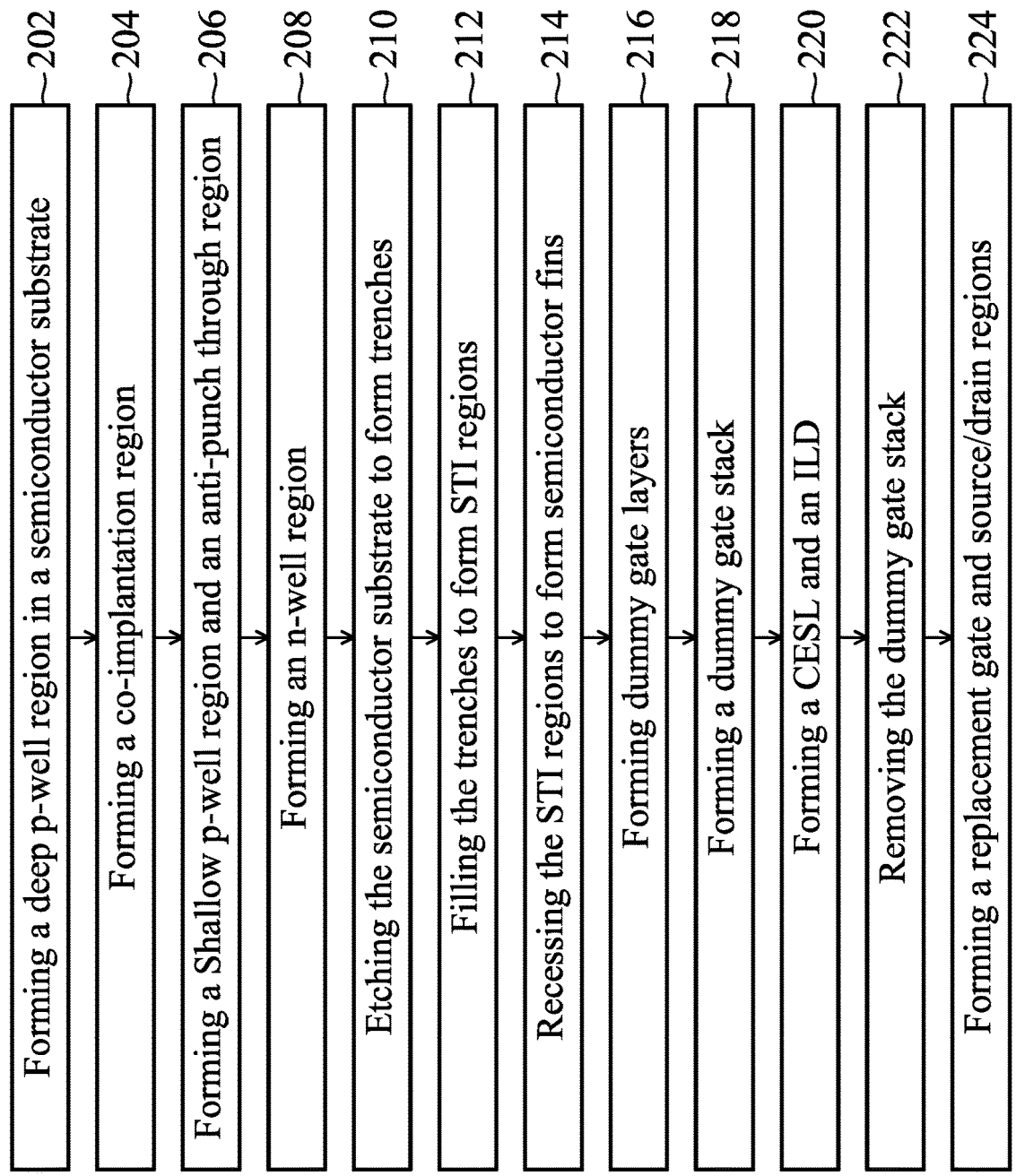
FIG. 20 illustrates a process flow for forming well regions and transistors in accordance with some embodiments.

FIGS. 1 through 15 illustrate the cross-sectional views and a perspective view of intermediate stages in the formation of well regions and FinFETs in accordance with some embodiments of the present disclosure. The corresponding processes are also reflected schematically in the process flow 200 as shown in FIG. 20.

FIG. 1 illustrates a cross-sectional view of substrate 20, which may be a part of wafer 10. Substrate 20 may be a part of a wafer, and may be a bulk semiconductor substrate or a Semiconductor-on-Insulator (SOI) substrate. Generally, an SOI substrate is a layer of a semiconductor material formed on an insulator layer. The insulator layer may be, for example, a Buried Oxide (BOX) layer, which may be a silicon oxide layer, or the like. The insulator layer is provided on a substrate, typically a silicon or glass substrate. Other substrates, such as a multi-layered or gradient substrate may also be used. In accordance with some embodiments, the semiconductor material of substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Substrate 20 has region 20N and region 20P. Region 20N can be used for forming n-type devices, such as NMOS transistors, e.g., n-type FinFETs. Region 20P can be used for forming p-type devices, such as PMOS transistors, e.g., p-type FinFETs. Throughout the description, regions 20N and 20P are referred to as an NMOS region and a PMOS region, respectively. NMOS region 20N may be joined with PMOS region 20P. Alternatively, NMOS region 20N may be separated from PMOS region 20P, and any number of device features (e.g., other active devices, doped regions, isolation structures, etc.) may be disposed between the region 20N and the region 20P.

Pad oxide 22 is formed over substrate 20. In accordance with some embodiments of the present disclosure, pad oxide 22 is formed of silicon oxide, which may be formed by oxidizing a surface layer of semiconductor substrate 20. In accordance with some embodiments of the present disclosure, pad oxide 22 may be formed through deposition, for example, using Atomic Layer Deposition (ALD), Plasma Enhanced Chemical Vapor Deposition (PECVD), or the like.

Figure 2:
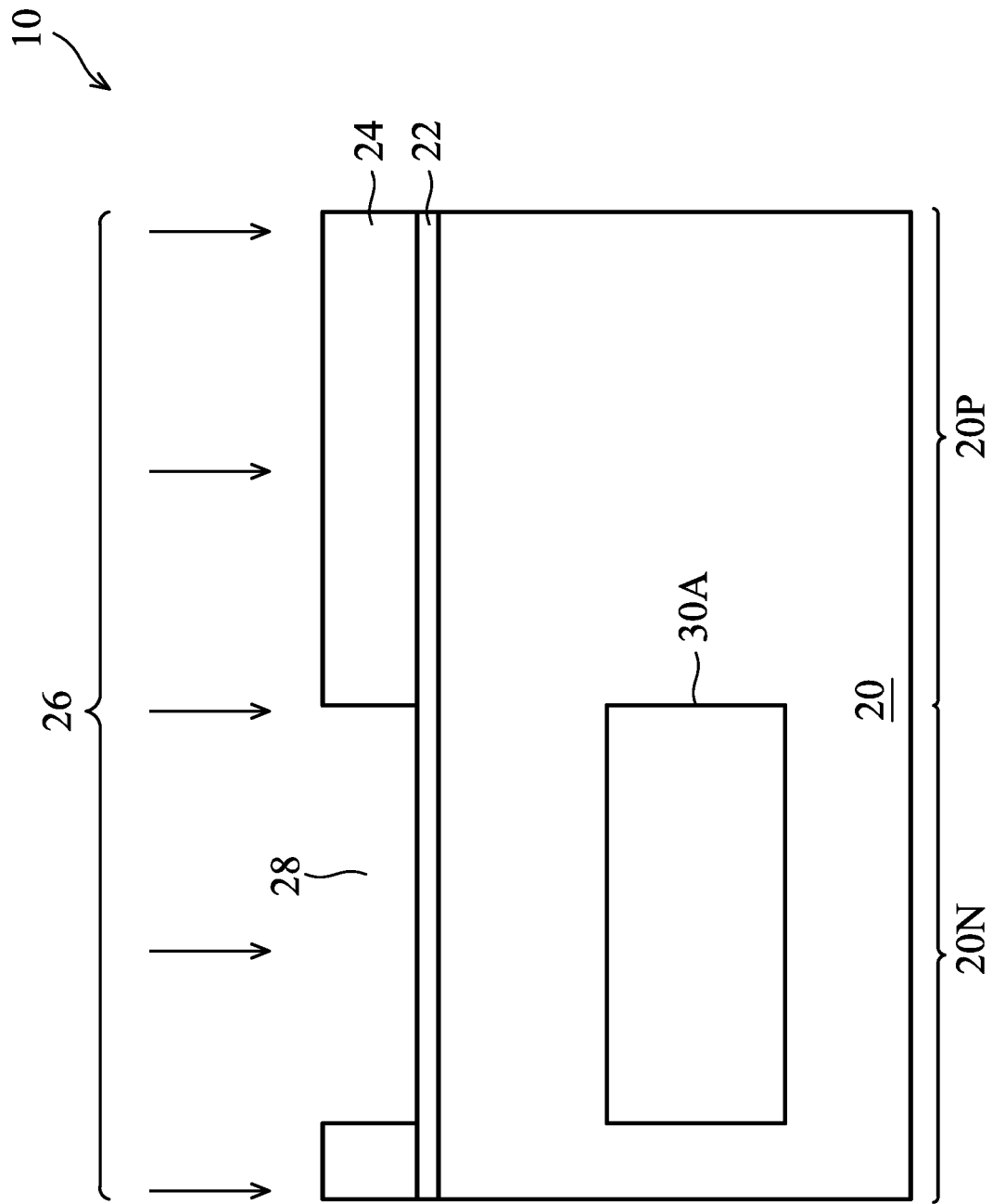

Referring to FIG. 2, implantation mask 24 is formed. In accordance with some embodiments of the present disclosure, implantation mask 24 is formed of photo resist, which is coated and then patterned to form opening 28 in NMOS region 20N. A p-type dopant implantation (marked as 26) is then performed to form deep p-well region 30A. The respective process is illustrated as process 202 in the process flow shown in FIG. 20. The p-type dopant may include boron, indium, or combinations thereof. The implantation may be performed using an energy in the range between about 50 keV and about 150 keV. Deep p-well region 30A is formed deep in substrate 20, with the top surface of deep p-well region 30A being spaced apart from the top surface of substrate 20. The p-type dopant concentration may be equal to or less than $10^{18}$ cm$^{-3}$, such as in the range between about $10^{17}$ cm$^{-3}$ and about $10^{18}$ cm$^{-3}$. It is appreciated that the p-type dopant (and the subsequently doped elements for co-implantation and n-well region) has a certain distribution (such as Gaussian distribution), and there may not be sharp edges/top surfaces/bottom surfaces. In accordance with some embodiments, if the concentration of a dopant falls below about 50 percent of its peak concentration, it is considered that the respective position is the edges/top surfaces/bottom surfaces.

Figure 3:
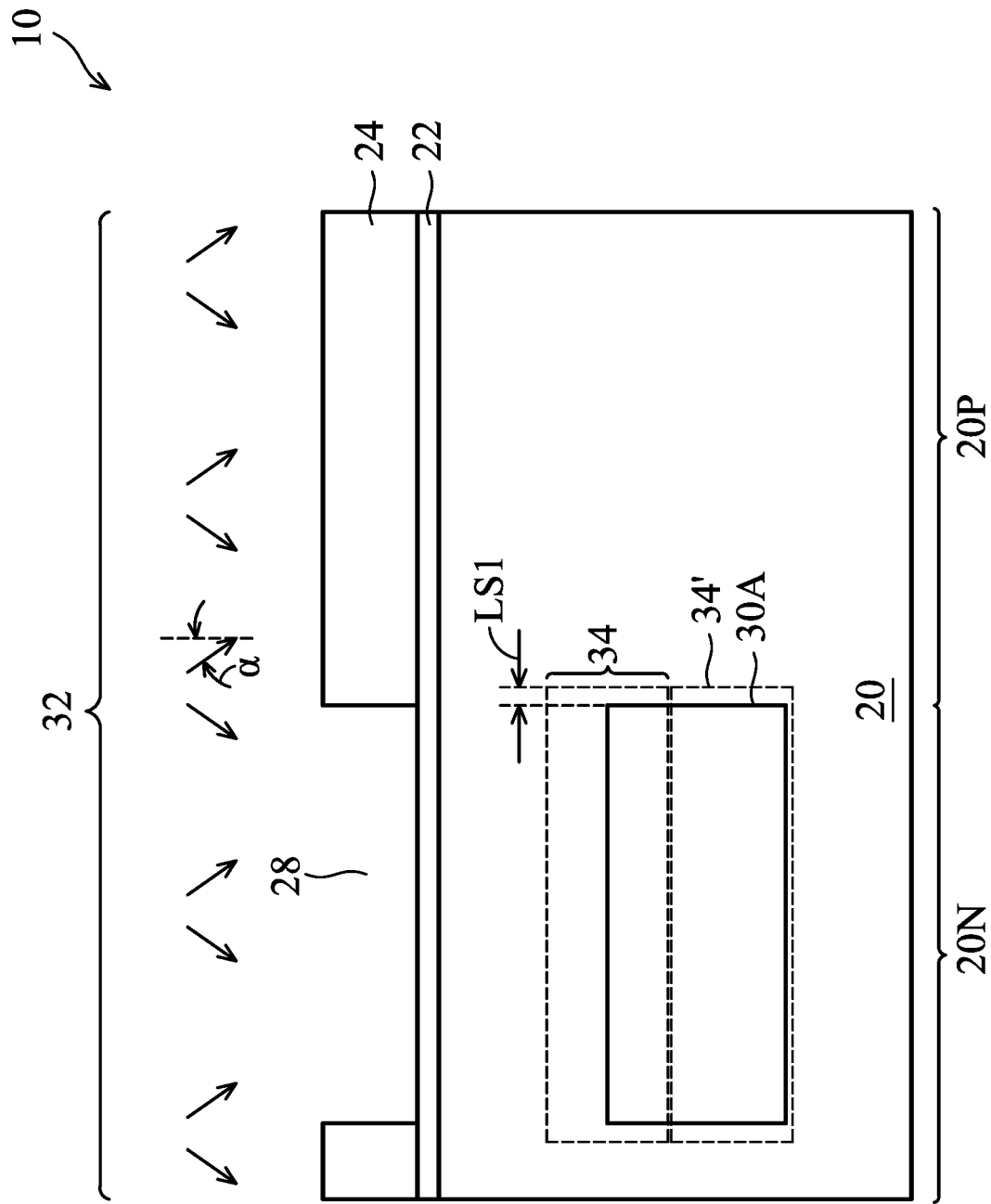

FIG. 3 illustrates the implantation of a diffusion-retarding element. The implantation is referred to as a co-implantation and denoted as 32 since the diffusion-retarding element is co-implanted with the p-well dopant. The respective process is illustrated as process 204 in the process flow shown in FIG. 20. The diffusion-retarding element may include carbon, while other types of diffusion-retarding element such as fluorine may be used or added in combination with carbon. As a result, co-implant region 34 is formed. In accordance with some embodiments, the bottom surface of co-implant region 34 is higher than the bottom surface of deep p-well region 30A. In accordance with alternative embodiments, the co-implant region 34 extends to the bottom surface of deep p-well region 30A, so that co-implant region 34 and an entire bottom portion of deep p-well region 30A occupy the same part of substrate 20. Accordingly, portion 34' of co-implant region 34 is schematically illustrated to show that co-implant region 34 may or may not extend to the bottom surface of deep p-well region 30A. In accordance with some embodiments of the present disclosure, the implantation energy is in the range between about 5 keV and about 50 keV. The concentration of the diffusion-retarding element may be in the range between about $10^{17}$ cm$^{-3}$ and about $10^{19}$ cm$^{-3}$, and higher or lower concentrations may also be used. The top surface of co-implant region 34 is spaced apart from the top surface of substrate 20. The depth of co-implant region 34 is also adjusted to an appropriate range, as will be discussed in subsequent paragraphs.

Figure 5:
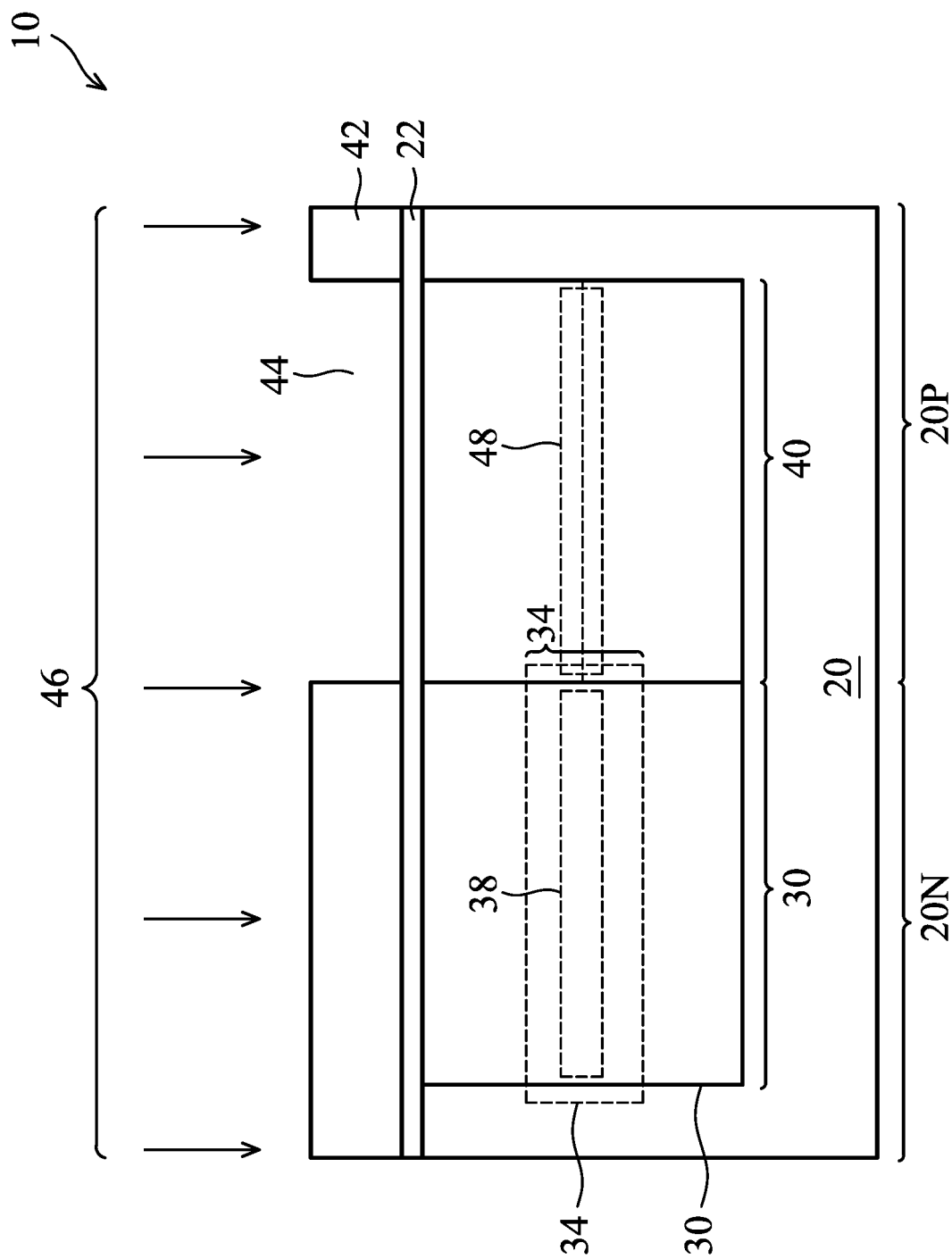

In accordance with some embodiments of the present disclosure, co-implantation process 32 includes tilt implantations. For example, as shown in FIG. 3, co-implantation process 32 includes a tilt implantation tilting toward PMOS region 20P. Accordingly, a portion of co-implant region 34 extends directly underlying implantation mask 24, and may extend into the subsequently formed N-well region 40 (FIG. 5). In accordance with some embodiments, tilt angle α is in the range between about 10 degrees and about 15 degrees. Co-implant region 34, depending on the tilt angle α and the implantation energy, may laterally extend beyond the edge of deep p-well region by distance LS1, which may be greater than about 20 nm or greater than about 60 nm, and may be in the range between about 20 nm and about 120 nm, or between about 60 nm and about 120 nm.

Figure 16:
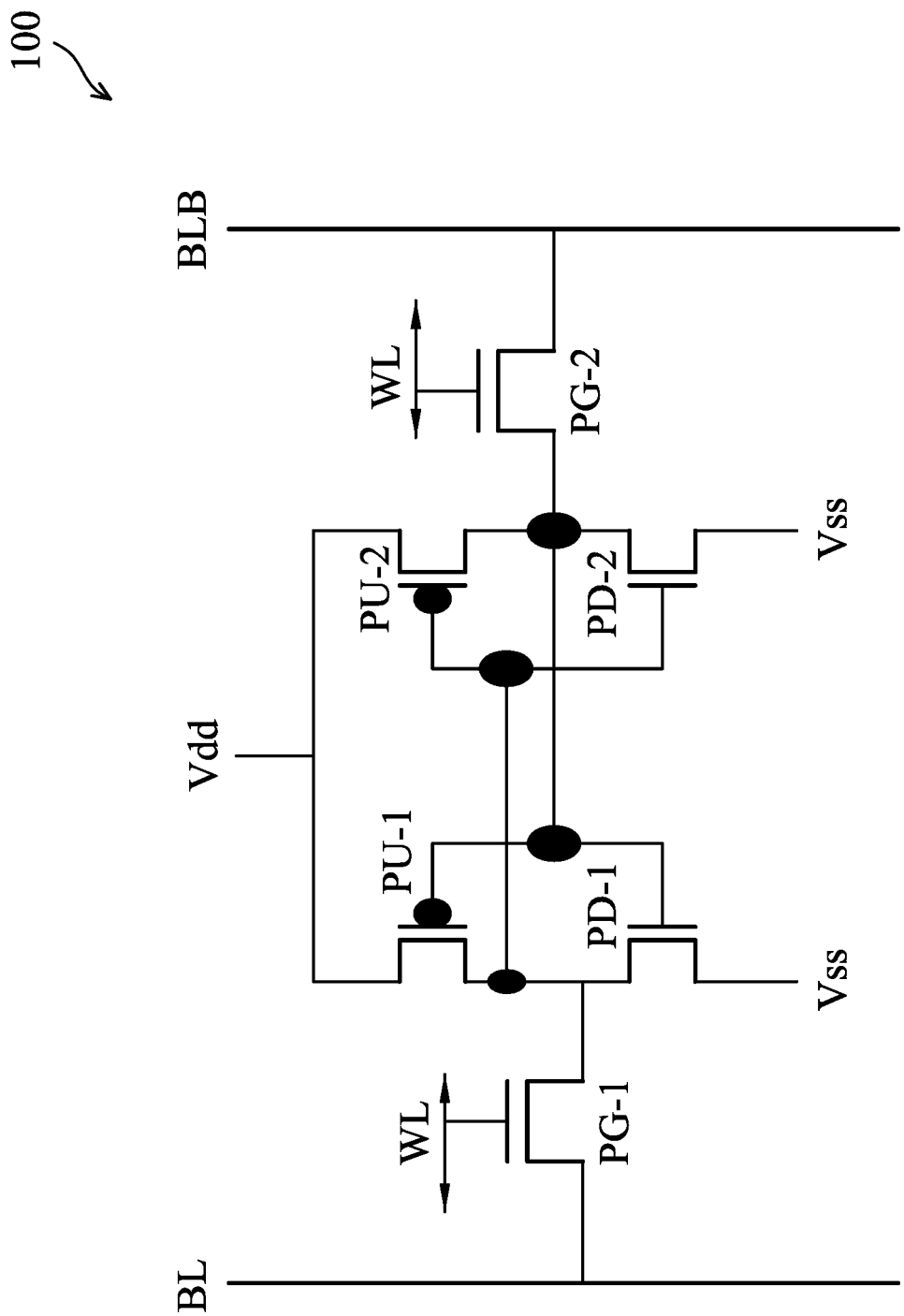
FIG. 16 illustrates a schematic diagram of a Static Random Access Memory (SRAM) cell in accordance with some embodiments.

The tilt implantation processes 32 may include the tilt implantation in a single direction toward PMOS region 20P. As shown in FIG. 3, the tilt implantation processes 32 may also include the tilt implantation tilting toward opposite directions (left and right in the illustrated example). Also, using the formation of the Static Random Access Memory (SRAM) cell 100 in FIG. 17 as an example, the tilt implantation of the diffusion-retarding element may include the tilt implantations in four directions including +X direction, −X direction, +Y direction, and −Y direction. The implantation may be performed by placing wafer 10 on an electrostatic chuck (not show), and rotating wafer 10 while at the same time performing the co-implantation. The top surface of wafer 10 is neither perpendicular nor parallel to the rotation axis, and hence with the rotation of wafer 10, wafer 10 is tilt implanted from all directions. Alternatively or in additional to the rotation implantation, the wafer 10 may be tilted implanted in certain directions such as the +X direction, or in +X and −X directions as shown in FIG. 16, without tilting toward directions such as +Y direction, −Y direction, and other directions.

Figure 4:
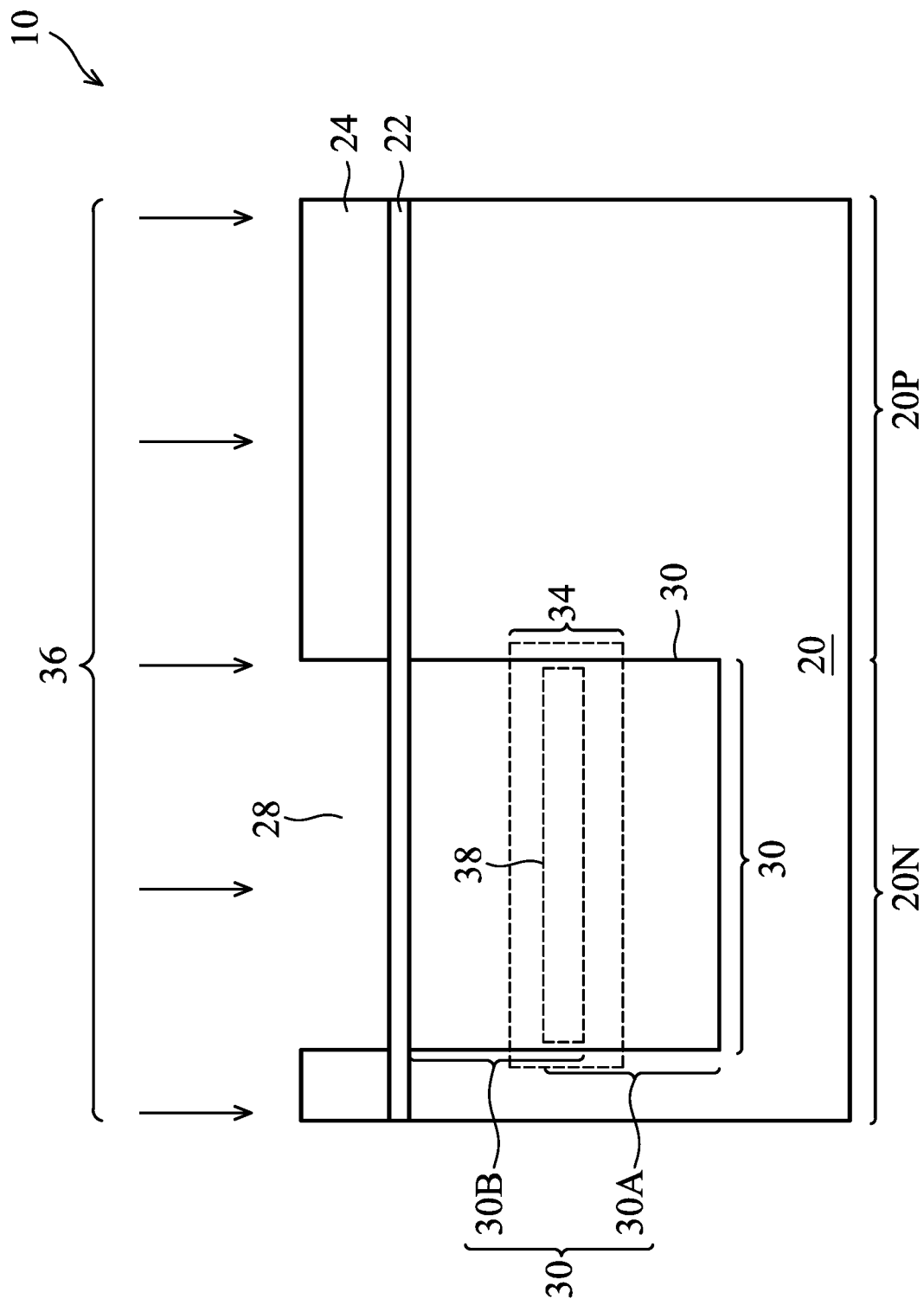

FIG. 4 illustrates a shallow p-well implantation 36 to form shallow p-well region 30B. The respective process is illustrated as process 206 in the process flow shown in FIG. 20. The p-type dopant may also include boron, indium, or combinations thereof. The implantation may be performed using an energy lower than the energy for forming deep p-well region 30A, and the implantation energy may be in the range between about 2 keV and about 50 keV. Shallow p-well region 30B extends to the top surface of substrate 20, and is joined to deep p-well region 30A. Shallow p-well region 30B also overlaps a bottom part of deep p-well region 30A. The p-type dopant concentration in shallow p-well region 30B may be equal to or less than $10^{18}$ cm$^{-3}$, such as in the range between about $10^{17}$ cm$^{-3}$ and about $10^{18}$ cm$^{-3}$. Deep p-well region 30A and shallow p-well region 30B are in combination referred to a p-well region 30 hereinafter.

An Anti-Punch-Through (APT) implantation is also performed to form anti-punch-through region 38. The respective process is also illustrated as process 206 in the process flow shown in FIG. 20. The conductivity type of the dopants implanted during the APT implantation is also p-type. Anti-punch-through region 38 has a top surface vertically spaced apart from the top surface of substrate 20, and may overlap (sharing a same region of substrate 20 with) a portion of co-implantation region 34. The position of anti-punch-through region 38 is selected so that it is below the bottom surfaces of the subsequently formed source/drain regions 76 (FIG. 15) in the resulting n-type FinFET, which is formed in subsequent steps. The anti-punch-through region 38 is used to reduce the leakage from the source/drain regions to substrate 20. The doping concentration in anti-punch-through region 38 may be in the range between about $1\times10^{18}/cm^3$ and about $1\times10^{19}/cm^3$ in accordance with some embodiments.

As is shown in FIGS. 2, 3, and 4, deep p-well region 30A, co-implant region 34, and shallow p-well region 30B may be formed using a same implantation mask 24. In accordance with alternative embodiments of the present disclosure, different implantation masks may be used. For example, co-implant region 34 may be implanted using a different implantation mask than the mask used for forming deep p-well region 30A and shallow p-well region 30B, so that the position and the size of co-implantation region 34 may be customized independently from the position and the size of deep p-well region 30A and shallow p-well region 30B. Implantation mask 24 is then removed, such as by an acceptable ashing process.

FIG. 5 illustrates the formation of n-well region 40 and Anti-punch-through region 48. Implantation mask 42 is formed and patterned, with opening 44 formed in implantation mask 42. The respective process is illustrated as process 208 in the process flow shown in FIG. 20. An n-type dopant implantation (marked as 46) process(es) is performed to form deep n-well region 40. The n-type dopant may include phosphorous, arsenic, antimony, or combinations thereof. In accordance with some embodiments of the present disclosure, the formation of n-well region 40 includes a first implantation process to form a deep n-well region (the lower part of n-well region 40), and a second implantation process to form a shallow n-well region (the upper part of n-well region 40). The energy for forming the deep n-well region may be in the range between about 50 keV and about 150 keV. The implantation energy for forming the shallow n-well region may be in the range between about 5 keV and about 50 keV. The n-type dopant concentration may be equal to or less than $10^{18}$ cm$^{-3}$, such as in the range between about $10^{17}$ cm$^{-3}$ and about $10^{18}$ cm$^{-3}$.

An anti-punch through implantation is also performed to form anti-punch-through region 48. The conductivity type of the dopants implanted during the anti-punch-through implantation is also n-type. Anti-punch-through region 48 has a top surface vertically spaced apart from the top surface of substrate 20. The position of anti-punch-through region 48 is selected so that it is under the bottom surfaces of the subsequently formed source/drain regions 78 (FIG. 15) in the resulting P-type FinFET, which will be formed in subsequent steps. The doping concentration in anti-punch-through region 48 may be in the range between about $1\times10^{18}/cm^3$ and about $1\times10^{19}/cm^3$ in accordance with some embodiments.

In accordance with some embodiments, no co-implantation (such as using carbon or fluorine) is performed to form co-implantation region in PMOS region 20P. Experiments have revealed that although the co-implantation in PMOS region 20P has effect in reducing the diffusion of the n-type dopant, the effect is not significant, and may or may not be able to justify the cost of the added co-implantation process. Accordingly, as shown in FIG. 5, no co-implantation region is formed in PMOS region 20P in accordance with some embodiments. In accordance with alternative embodiments, a co-implantation region is formed, for example, to a similar depth as co-implantation region 34. The co-implantation may be performed using carbon and/or fluorine, with the process details similar to that for forming co-implantation region 38. Implantation mask 42 is then removed.

Figure 6:
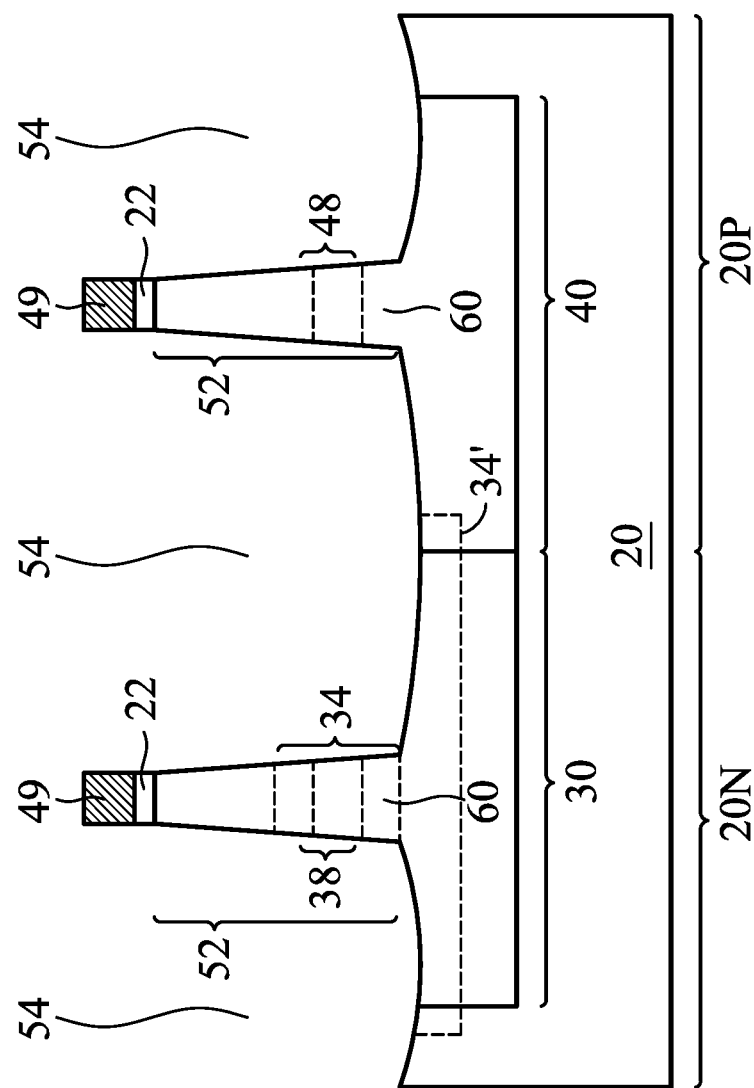

In FIG. 6, semiconductor strips 52 (also referred to as fins) are formed. In accordance with some embodiments, semiconductor strips 52 are formed by etching substrate 20 to form trenches 54, with the remaining portions of semiconductor substrate 20 between trenches 54 being semiconductor strips 52. The respective process is illustrated as process 210 in the process flow shown in FIG. 20. The etching may be performed using any acceptable etch process, such as a Reactive Ion Etch (RIE) process, a Neutral Beam Etch (NBE) process, the like, or a combination thereof. The etching may be anisotropic. The etching may be performed using a patterned hard mask 49, which may be formed of, for example, silicon nitride, silicon oxynitride, or the like.

In above-illustrated embodiments, the semiconductor strips/fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

In accordance with some embodiments, the bottoms of trenches 54 are higher than the bottoms of p-well region 30 and n-well region 40. The bottoms of trenches 54 may be level with (as shown in FIG. 6) the bottom surface of co-implantation region 34. Alternatively, the bottoms of trenches 54 are higher than the bottom surface of co-implantation region 34. Accordingly, co-implantation region 34 may extend directly underlying trench 54, as represented by dashed lines marked as 34'.

Figure 7:
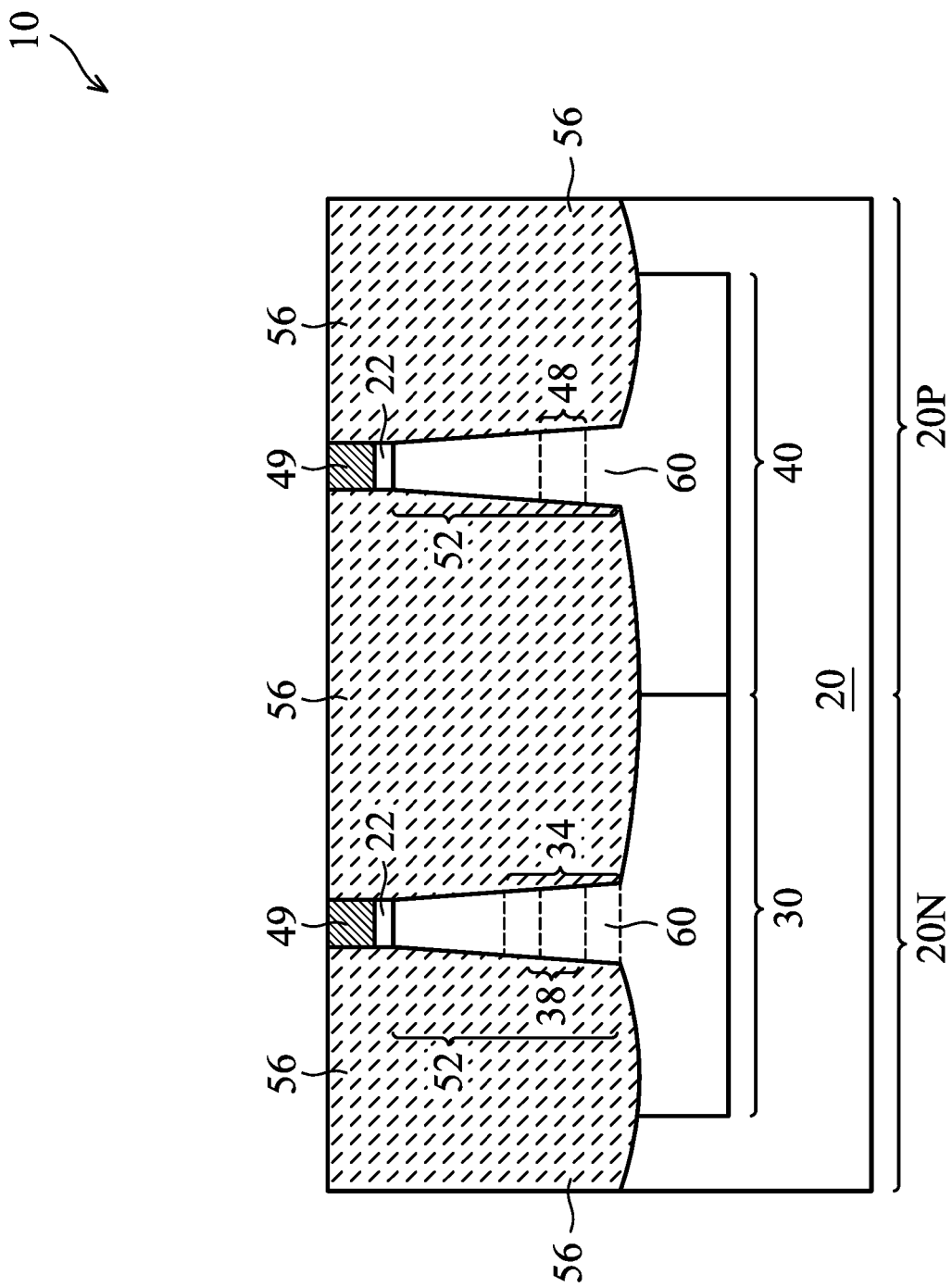

In FIG. 7, isolation material 56 (which is a dielectric material) is formed to have portions between neighboring semiconductor strips 52. The respective process is illustrated as process 212 in the process flow shown in FIG. 20. Isolation material 56 may be an oxide such as silicon oxide, a nitride such as silicon nitride, the like, or a combination thereof, and may be formed by a High Density Plasma Chemical Vapor Deposition (HDP-CVD), a Flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, isolation material 56 is silicon oxide formed by a FCVD process. An anneal process may be performed once the insulation material is formed. In accordance with some embodiments, isolation material 56 is formed such that excess isolation material 56 covers the semiconductor strips 52. Although isolation material 56 is illustrated as a single layer, some embodiments may utilize multiple layers. For example, in some embodiments a liner (not shown) may first be formed along a surface of the substrate 20 and the semiconductor strips 52. Thereafter, a filling material such as those discussed above may be formed over the liner.

The anneal process in the formation of isolation material 56 involves elevated temperature. The anneal process and other thermal process in subsequent steps may cause the diffusion of the dopant in p-well region 30 and n-well region 40. For example, the boron atoms in p-well region 30 are prone to the diffusion under thermal budget. In the diffusion, the boron atoms can form clusters with interstitial defects in substrate 20. The out-diffusion of the dopants in p-well region 30 and n-well region 40 causes the increase in the resistivity in the corresponding well regions. In addition, the diffusion of the well dopants causes the inter-diffusion between p-well region 30 and n-well region 40, wherein the diffused dopants neutralize the dopants in neighboring well regions, causing the effective dopant concentration to drop. Also, the dopants in semiconductor strips 52 are diffused into isolation material 56, also resulting in the reduction of the dopant concentration in semiconductor strips 52. The increase in the resistivity may cause the parasitic Bipolar Transistors in the resulting FinFETs to be turned on, and hence causing the resulting CMOS device to latch up. In accordance with some embodiments of the present disclosure, the co-implantation of the diffusion-retarding element causes the well dopant (such as boron) to have reduced diffusion rate, and hence the likelihood of latch up is reduced.

A planarization process such as a Chemical Mechanical Polish (CMP) process may be performed to remove the excess portions of isolation material 56 over the top surfaces of hard mask 49, and the resulting isolation material 56 is also referred to as Shallow Trench Isolation (STI) regions 56.

Figure 8:
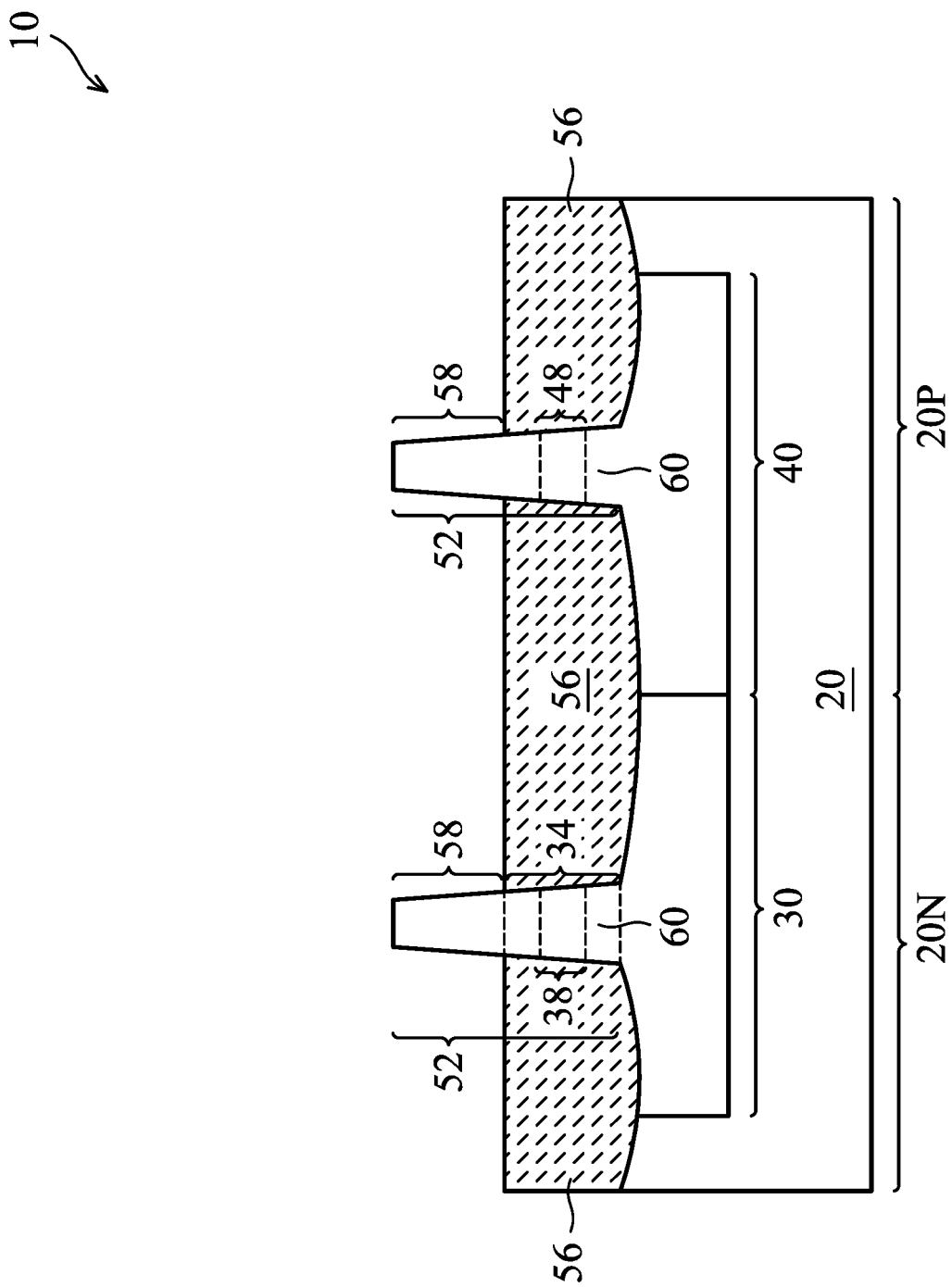

Next, hard mask 49 is removed, and pad oxide 22 may also be removed, for example, through etching. In a subsequent process, STI regions 56 are recessed, for example, in an etch back process, so that the top surfaces of STI regions 56 are lower than the top surfaces of semiconductor strips 52. The resulting structure is shown in FIG. 8. The respective process is illustrated as process 214 in the process flow shown in FIG. 20. The portions of semiconductor strips 52 higher than the top surfaces of STI regions 56 are referred to as protruding fins 58 hereinafter. The portions of semiconductor strips 52 below the top surfaces of STI regions 56 are referred to as sub-fins 60. Furthermore, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. STI regions 56 may be recessed using an acceptable etching process, such as one that is selective to the material of isolation material 56 (e.g., etches the material of isolation material 56 at a faster rate than the material of the semiconductor strips 52). For example, a chemical oxide removal process with a suitable etch process using, for example, dilute hydrofluoric (dHF) acid may be used.

In accordance with some embodiments of the present disclosure, the top surfaces of the recessed STI regions 56 are substantially level with the top surface of co-implantation region 34. In accordance with alternative embodiments, the top surfaces of the recessed STI regions 56 are slightly higher than or lower than the top surface of co-implantation region 34, for example, with the height difference between the top surfaces of the recessed STI regions 56 and the top surface of co-implantation region 34 being smaller than about 10 nm.

Figure 9:
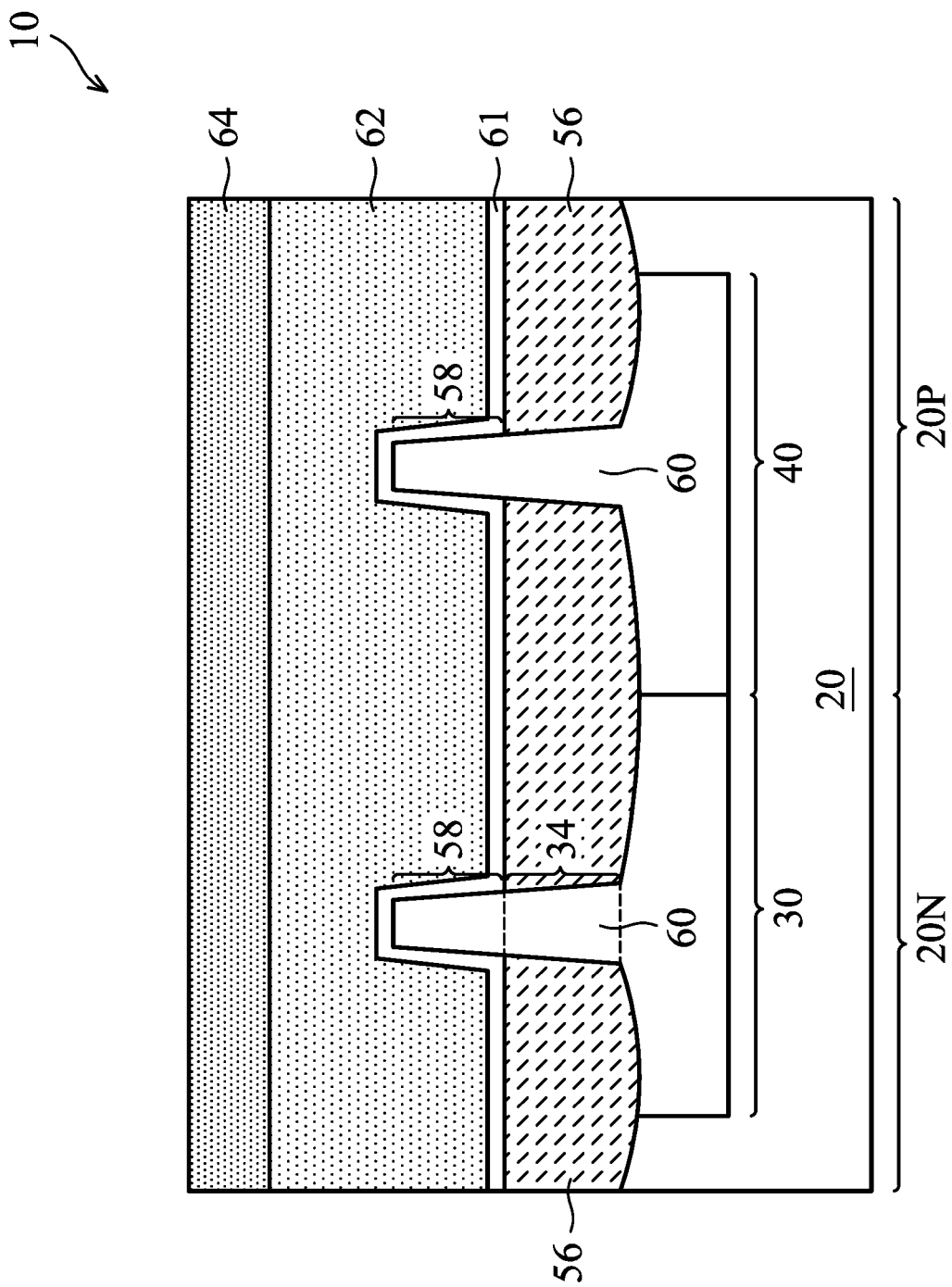

In FIG. 9, dummy dielectric layer 61 is formed on protruding fins 58, and dummy dielectric layer 61 may extend into NMOS region 20N and PMOS region 20P. The respective process is illustrated as process 216 in the process flow shown in FIG. 20. Dummy dielectric layer 61 may be formed of, for example, silicon oxide, silicon nitride, a combination thereof, or like, and may be deposited or thermally grown according to acceptable techniques. Dummy gate layer 62 is formed over dummy dielectric layer 61, and mask layer 64 is formed over dummy gate layer 62. Dummy gate layer 62 may be deposited over dummy dielectric layer 61 and then planarized, such as by a CMP process. Mask layer 64 may be deposited over dummy gate layer 62. Dummy gate layer 62 may be formed of polycrystalline-silicon (polysilicon), amorphous silicon, or the like. Dummy gate layer 62 may be deposited through Physical Vapor Deposition (PVD), CVD, sputter deposition, or other applicable techniques. Mask layer 64 may include, for example, SiN, SiON, or like. In accordance with some embodiments, dummy dielectric layer 61 is formed on protruding fins 58, and does not extend on STI regions 56. In accordance with other embodiments, as shown in FIG. 9, dummy dielectric layer 61 is deposited such that dummy dielectric layer 61 further covers STI regions 56 besides on protruding fins 58.

Figure 10:
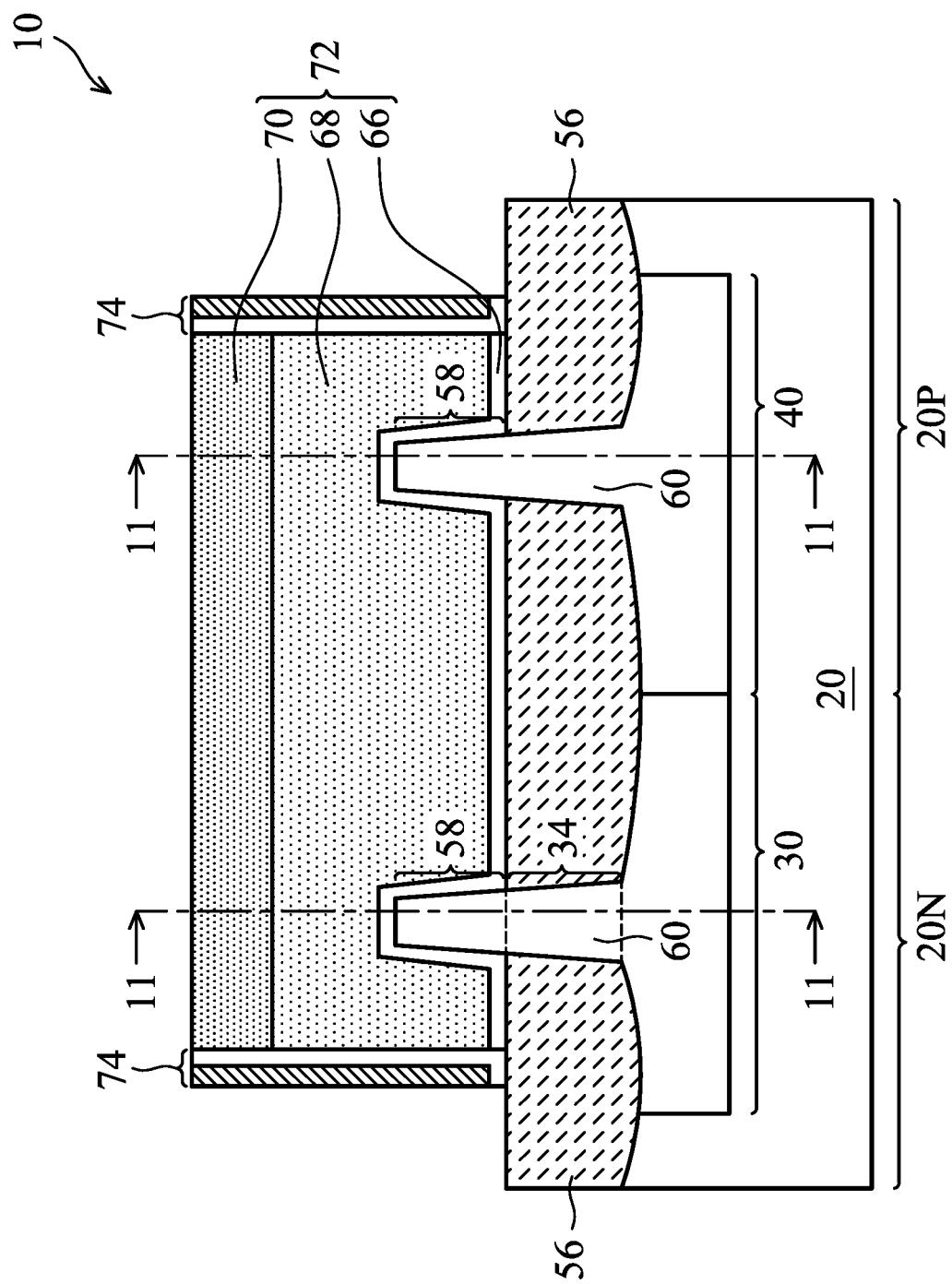

Mask layer 64 may be patterned using acceptable photolithography and etching techniques to form hard masks 70, as shown in FIG. 10. The pattern of hard masks 70 is then transferred through etching to dummy gate layer 62 to form dummy gate 68, and possibly dummy dielectric layer 61 to form dummy gate dielectric 66. The respective process is illustrated as process 218 in the process flow shown in FIG. 20. The etching may stop on dummy dielectric layer 61, or alternatively, dummy dielectric layer 61 is also etched to form dummy gate dielectrics 66. Dummy gate dielectric 66, dummy gate 68, and hard mask 70 are collectively referred to as dummy gate stack 72.

As also shown in FIG. 10, gate spacers 74 are formed on the sidewalls of dummy gate stack 72. Gate spacers 74 may be formed by conformally depositing an insulating material and subsequently anisotropically etching the insulating material. The insulating material of the gate spacers 74 may be silicon nitride, silicon carbo-nitride, a combination thereof, or the like. There may also be a gate seal spacer (not shown) formed along the sidewalls of dummy gate stack 72, and located between dummy gate stack 72 and gate spacers 74.

Figure 11:
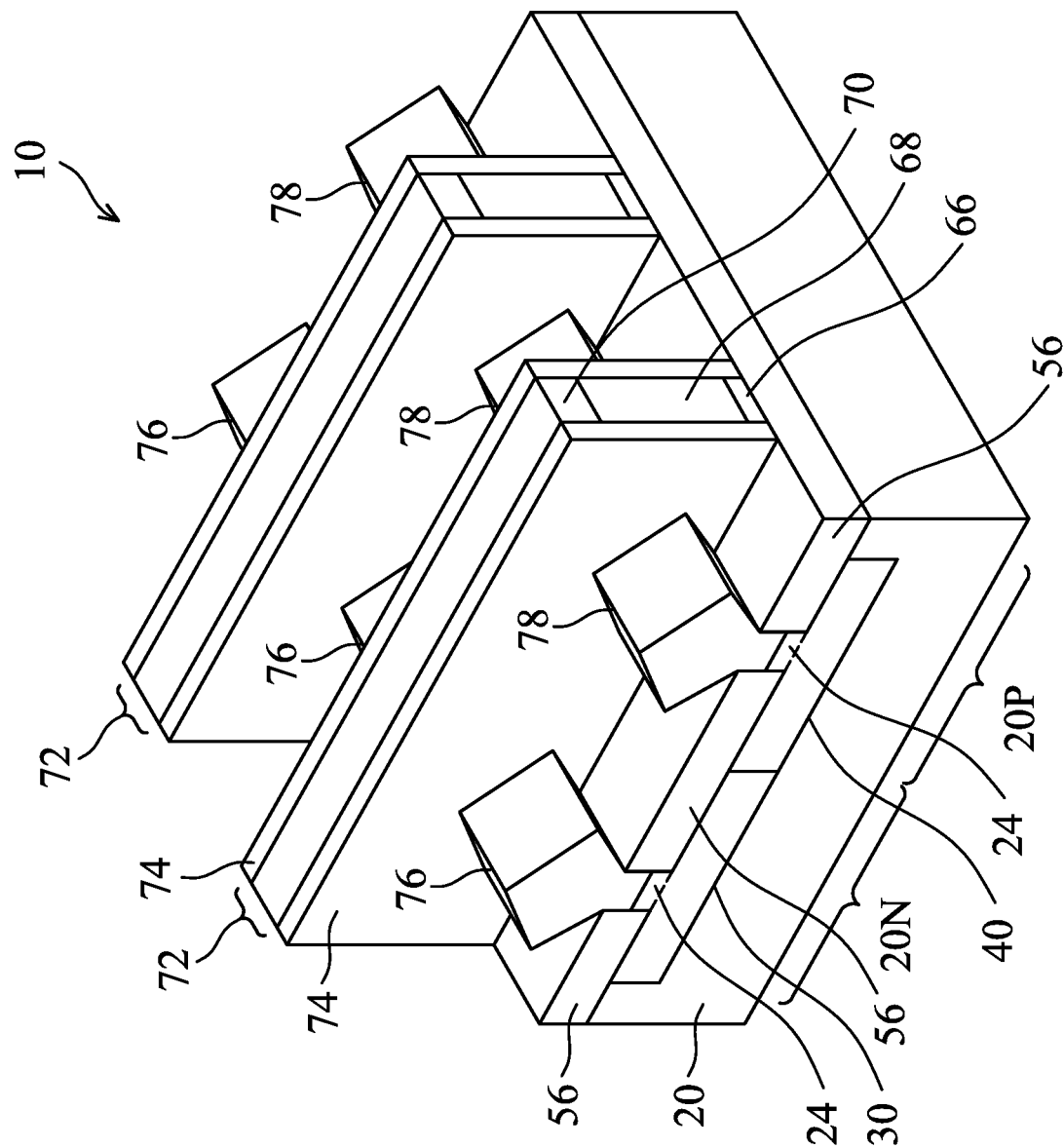

FIG. 11 illustrates a perspective view, in which epitaxy source/drain regions of FinFETs are formed. In accordance with some embodiments, epitaxial source/drain regions 76 and 78 are formed based on protruding fins 58 to exert stress in the channel regions of the respective FinFETs, thereby improving performance. Epitaxial source/drain regions 76 and 78 are formed based on protruding fins 58. In accordance with some embodiments, epitaxial source/drain regions 76 and 78 extend into, and may also penetrate through, the neighboring portions of protruding fins 58. In accordance with some embodiments, gate spacers 74 are used to separate epitaxial source/drain regions 76 and 78 from dummy gate stacks 72 by an appropriate lateral distance so that epitaxial source/drain regions 76 and 78 do not short out subsequently formed gates of resulting FinFETs.

Epitaxial source/drain regions 76 may be formed by masking PMOS region 20P, and etching protruding fins 58 in region 20N to form recesses in protruding fins 58. Then, epitaxial source/drain regions 76 are epitaxially grown in the recesses in NMOS region 20N. Epitaxial source/drain regions 76 may include any acceptable material, such as appropriate for n-type FinFETs. For example, if protruding fin 58 is formed of silicon, epitaxial source/drain regions 76 may include the materials that can exert a tensile strain in the respective n-type FinFET, such as silicon, SiC, SiCP, SiP, or like. Epitaxial source/drain regions 76 may have surfaces raised from respective surfaces of protruding fins 58.

Epitaxial source/drain regions 78 in PMOS region 20P may be formed by masking NMOS region 20N, and etching protruding fins 58 in region 20P to form recesses in protruding fins 58. Then, epitaxial source/drain regions 78 are epitaxially grown in the recesses in PMOS region 20P. Epitaxial source/drain regions 78 may include any acceptable material, such as appropriate for p-type FinFETs. For example, if protruding fin 58 is formed of silicon, epitaxial source/drain regions 78 may comprise materials exerting a compressive strain in channel region, such as SiGe, SiGeB, Ge, GeSn, or like. Epitaxial source/drain regions 78 may also have surfaces raised from respective surfaces of protruding fins 58.

Epitaxial source/drain regions 76 and 78 may be implanted with dopants to form source/drain regions, followed by an activation process. The source/drain regions may have a dopant concentration in the range between about $10^{19}/cm^3$ and about $10^{21}/cm^3$. The n-type and/or p-type dopants for source/drain regions 76 and 78 may be any of dopants previously discussed. In accordance with some embodiments, epitaxial source/drain regions 76 and 78 may be in situ doped during growth.

As a result of the epitaxy processes used to form epitaxial source/drain regions 76 and 78 in region 20N and region 20P, upper surfaces of epitaxial source/drain regions have facets which expand laterally outward beyond a sidewalls of protruding fins 58. In accordance with some embodiments, these facets cause adjacent source/drain regions of a same FinFET to merge. In other embodiments, adjacent source/drain regions 76 (or 78) remain separated after epitaxy process is completed.

Figure 12:
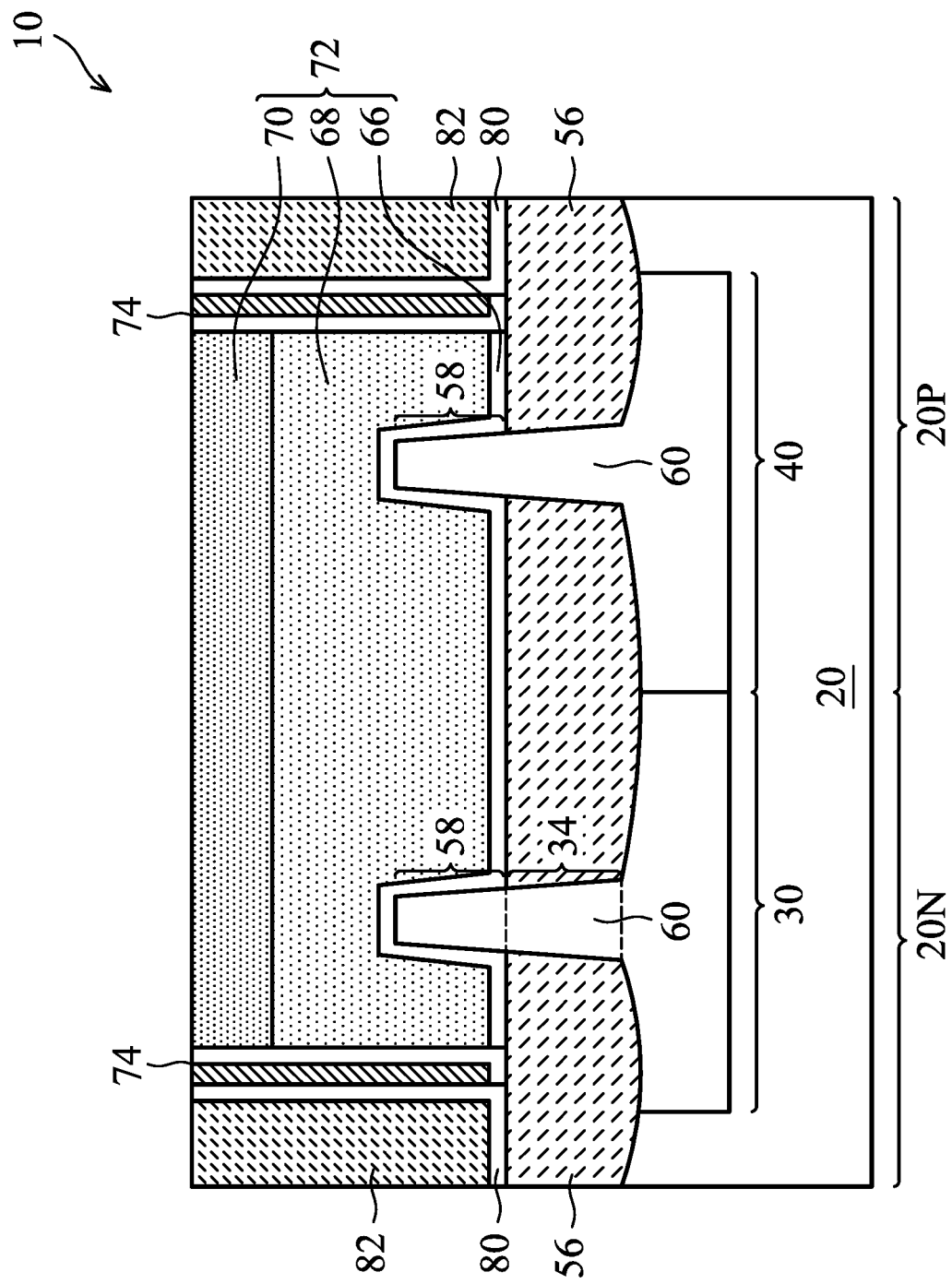

In FIG. 12, Contact Etch Stop Layer (CESL) 80 and Inter-Layer Dielectric (ILD) 82 are deposited over the structure illustrated in FIG. 11. The respective process is illustrated as process 220 in the process flow shown in FIG. 20. CESL 80 may comprise a dielectric material such as silicon nitride, silicon oxide, silicon oxynitride, or like, which has a different etching rate than material of overlying ILD 82. ILD 82 may be formed of a dielectric material, and may be deposited by any suitable method, such as CVD, PECVD, or FCVD. ILD 82 may also be formed of a dielectric material including Phospho-Silicate Glass (PSG), Boro-Silicate Glass (BSG), Boron-Doped Phospho-Silicate Glass (BPSG), Undoped Silicate Glass (USG), or like.

After the deposition of CESL 80 and ILD 82, a planarization process such as a CMP process or a mechanical polish process is performed to level the top surface of ILD 82 with the top surfaces of dummy gate stacks 72 or the top surface of hard mask 70. The planarization process may also remove portions of gate spacers 74. After the planarization process, the top surfaces of dummy gate stacks 72, gate spacers 74, and ILD 82 are level with each other.

Figure 13:
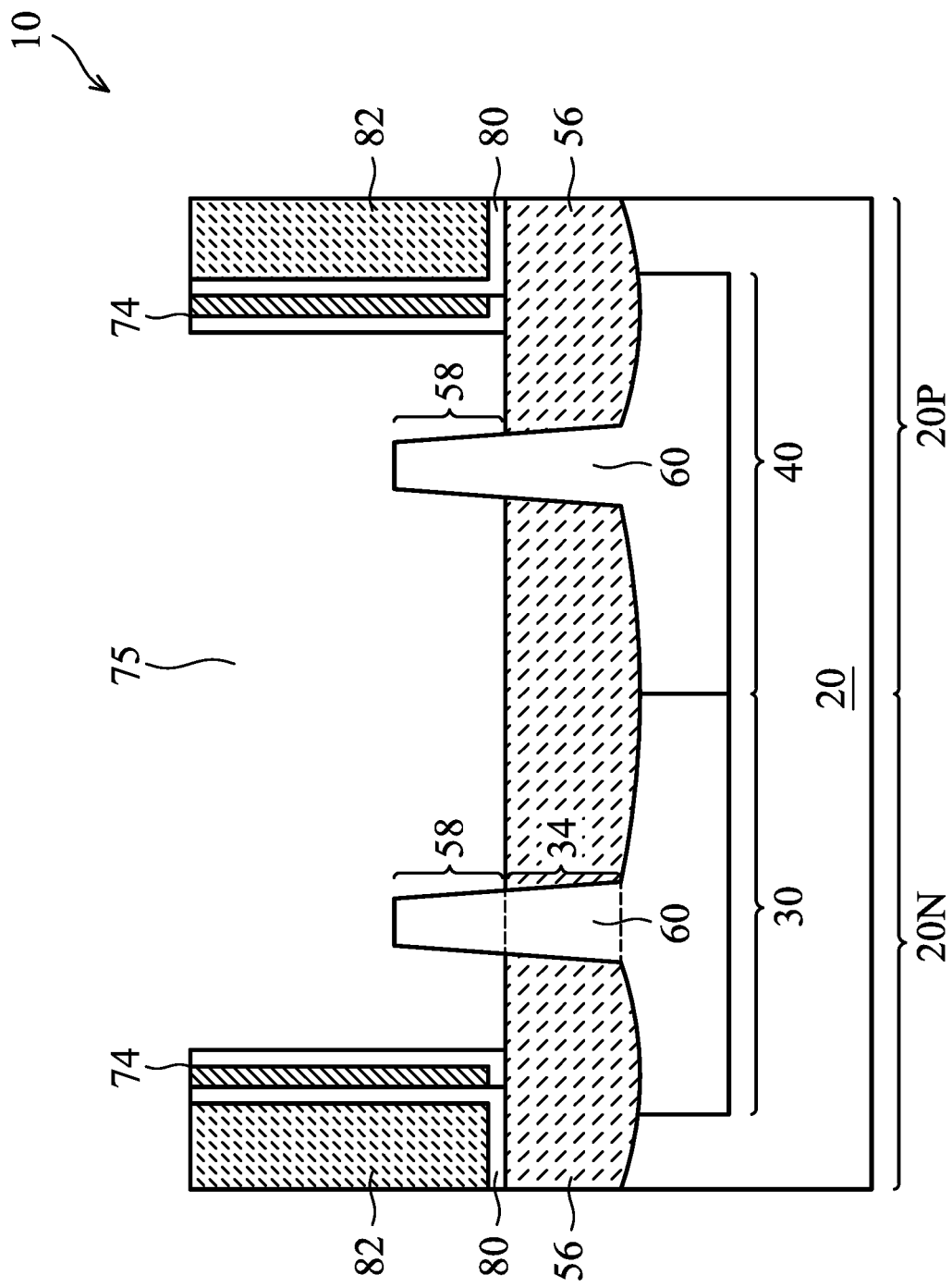

FIG. 13 illustrates the selective removal of the dummy gate stack 72 (see FIG. 12), thereby forming trench 75, which may extend into both NMOS region 20N and PMOS region 20P in accordance with some examples of embodiments. In accordance with some embodiments, dry etching processes are used to remove dummy gate stacks 72. The respective process is illustrated as process 222 in the process flow shown in FIG. 20. Dummy gate stack 72 may be selectively etched using either dry or wet etching. In the case dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. In the case wet etching is used, the chemicals may include $NH_4OH:H_2O_2:H_2O$ (APM), $NH_2OH$, KOH, $HNO_3:NH_4F:H_2O$, and/or the like.

In accordance with some embodiments in which the dummy gate stack 72 includes a silicon oxide as dummy gate dielectric 66, the silicon oxide may be removed using a wet etch process using a dilute hydrofluoric acid. If similar materials are utilized for the ILD 82 and the dummy gate dielectric 66, a mask may be used to protect the ILD 82 during the removal of dummy gate dielectric 66.

Figure 14:
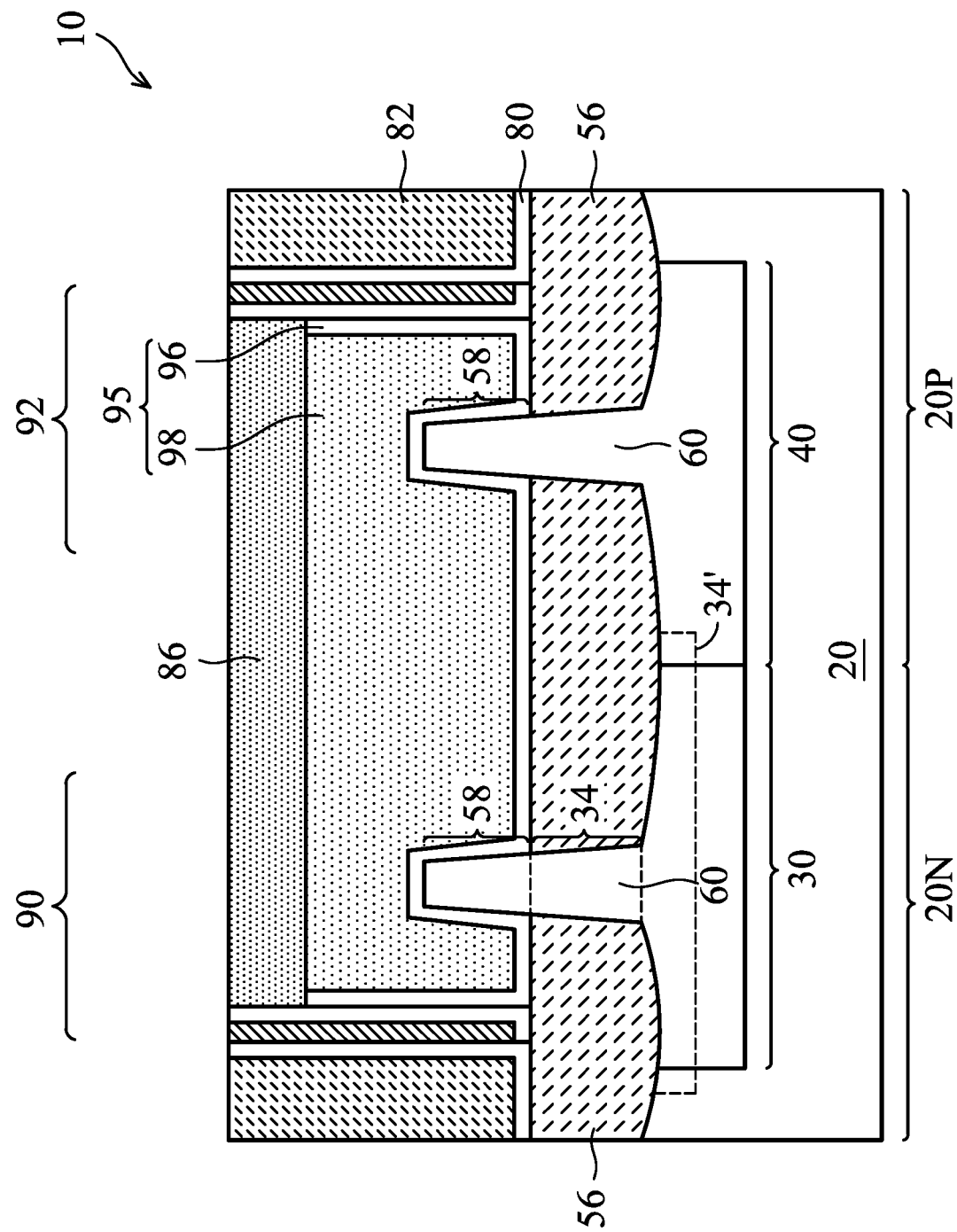
Figure 15:
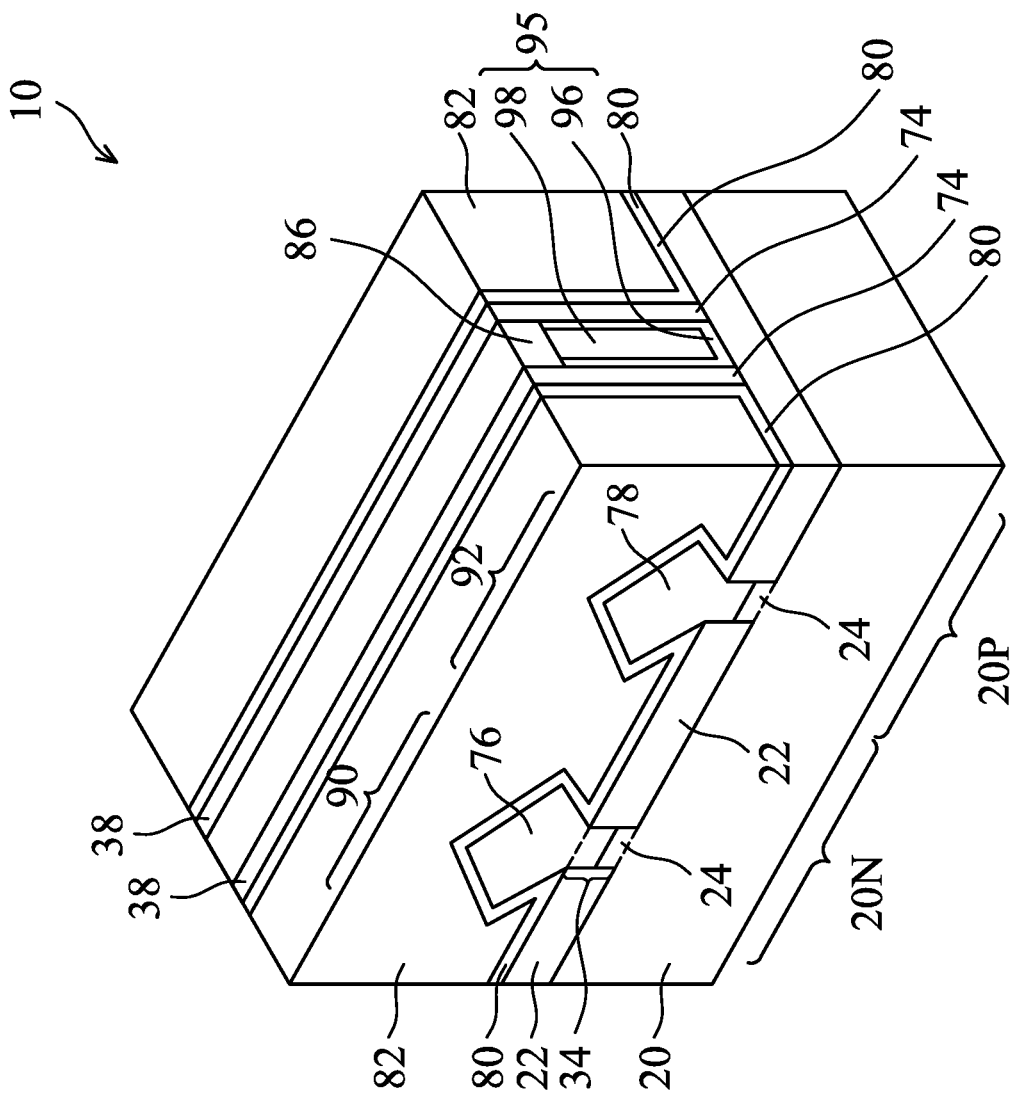

FIG. 14 illustrates a cross-section of wafer 10, in which replacement gate stack 95 is formed, which includes replacement gate dielectric 96 and replacement gate electrode 98. The respective process is illustrated as process 224 in the process flow shown in FIG. 20. FIG. 15 illustrates a perspective view of the structure shown in FIG. 14. The formation of replacement gate stack 95 may include forming/depositing a dielectric layer(s) and conductive layers over the dielectric layers, and performing a planarization process to remove the portions of the dielectric layer and the conductive layer over ILD 82. In accordance with some embodiments, gate dielectrics 96 comprise silicon oxide, silicon nitride, or multilayers thereof. In accordance with some embodiments, gate dielectrics 96 include a high-k dielectric material, and in these embodiments, gate dielectrics 96 may have a k value greater than about 7.0, and may include a metal oxide or a silicate of Hf, Al, Zr, La, Mg, Ba, Ti, Pb, and combinations thereof. The formation methods of gate dielectric 96 may include Molecular-Beam Deposition (MBD), ALD, PECVD, and like.

Gate electrodes 98 may include a metal-containing material such as TiN, TiO, TaN, TaC, Co, Ru, Al, W, combinations thereof, or multi-layers thereof. The formation of gate dielectrics 96 in region 20N and region 20P may occur simultaneously such that gate dielectrics 96 in regions 20N and 20P are formed from a same dielectric material, and formation of gate electrodes 98 may occur simultaneously such that gate electrodes 98 in regions 20N and 20P are formed from a same conductive material. In accordance with some embodiments, gate dielectrics 96 in NMOS region 20N and PMOS region 20P may be formed by distinct processes, such that gate dielectrics 96 may be different materials, and/or gate electrodes 98 in each region may be formed by distinct processes, such that gate electrodes 98 may be different materials. Various masking steps may be used to mask and expose appropriate regions when using distinct processes.

In accordance with some embodiments, replacement gate stack 95 is recessed, so that a recess is formed directly over the remaining portion of gate stack 95 and between opposite portions of gate spacers 74. A dielectric material such as silicon nitride, silicon oxynitride, or the like is then filled into the recess, followed by a planarization process to remove the portions of the dielectric layer higher than gate spacers 74 and ILD 82, so that a hard mask 86 is left covering the gate stack 95. Source/drain silicide regions (not shown) and gate contact plugs may then be formed to electrically connect to source/drain regions 76 and 78. A gate contact plug (not shown) may also be formed to connect to gate stack 95. N-type FinFET 90 and P-type FinFET 92 are thus formed.

Figure 17:
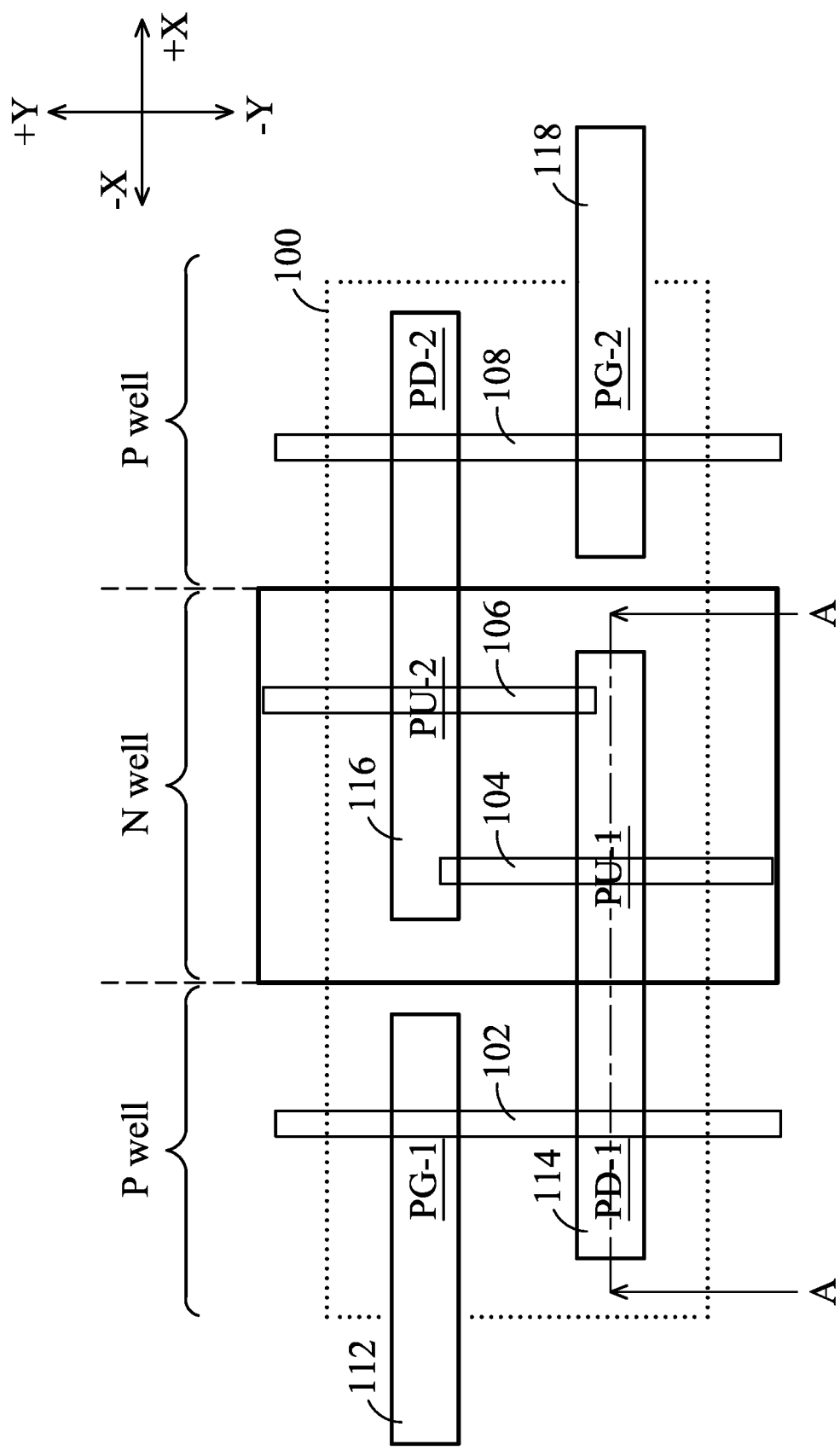
FIG. 17 illustrates a layout of a SRAM cell in accordance with some embodiments.

FIGS. 16 and 17 illustrate an example, in which the N-type FinFET 90 and P-type FinFET 92 may be formed. For example, FIG. 16 illustrates a Static Random Access Memory (SRAM) cell 100, which includes pull-up transistors PU-1 and PU-2, pull-down transistors PD-1 and PD-2, and pass-gate transistors PG-1 and PG-2. The transistors are interconnected, and are connected to power supply node VDD, electrical ground VSS, word line WL, and bit-lines BL and BLB (a complementary bit line).

FIG. 17 illustrates a layout of SRAM cell 100, which includes an n-well region and two p-well regions on the opposite sides of the n-well region. Semiconductor fins 102, 104, 106, and 108 are formed as being parallel to each other, and gate stacks 112, 114, 116, and 118 are formed crossing over the corresponding underlying semiconductor fins 102, 104, 106, and 108 to form transistors PG-1, PD-1, PU-1, PU-2, PD-2, and PG-2. In accordance with some embodiments of the present disclosure, the cross-sectional view obtained from the plane containing line A-A in FIG. 17 corresponds to the structure shown in FIG. 14. Gate stack 114 in FIG. 17 corresponds to the gate stack 95 in FIGS. 14 and 15. Fins 102 and 104 in FIG. 17 correspond to the protruding fins 58 in NMOS region 20N and PMOS region 20P, respectively. Pull-down transistor PD-1 and pull-up transistor PU-1 in FIG. 17 correspond to FinFETs 90 and 92, respectively, in FIGS. 14 and 15.

Figure 18:
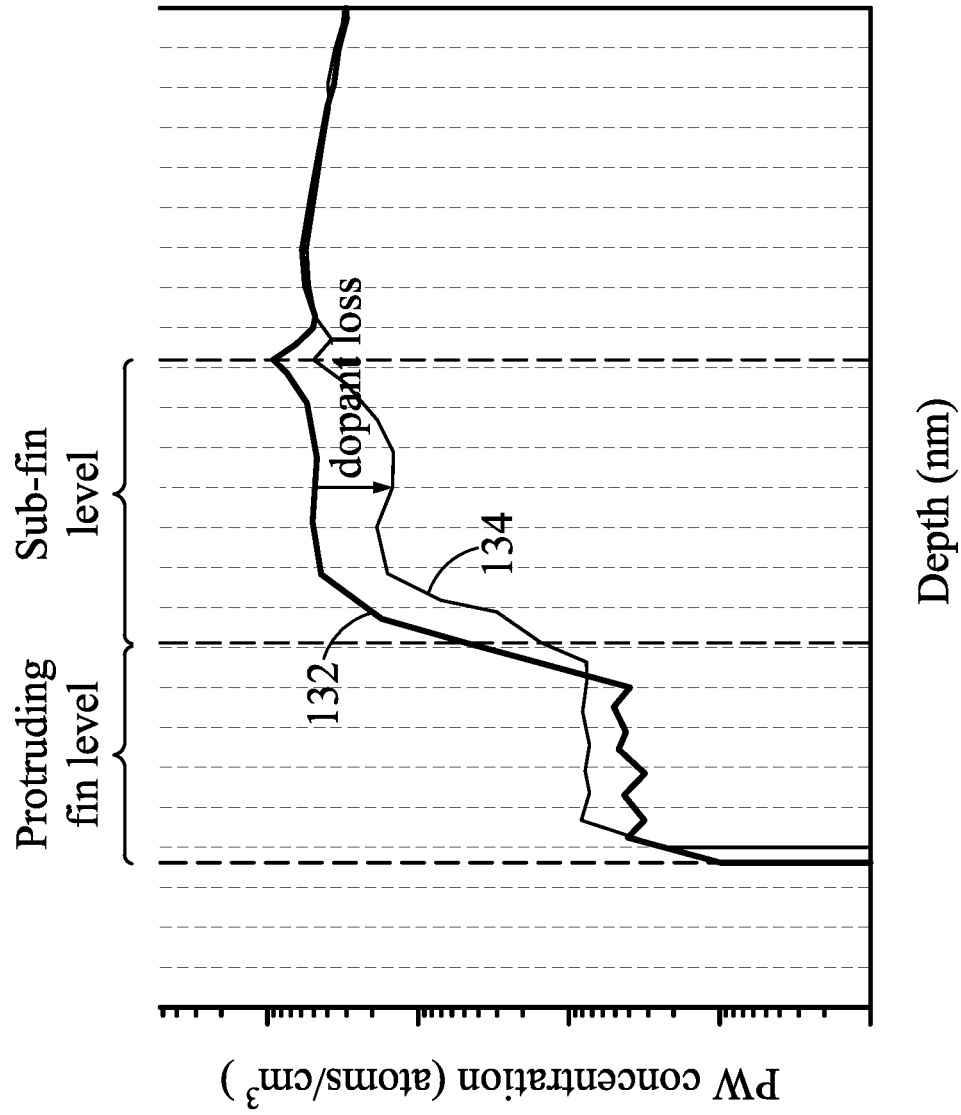
FIGS. 18 and 19 illustrate the comparisons of dopant concentrations in well regions in accordance with some embodiments.
Figure 19:
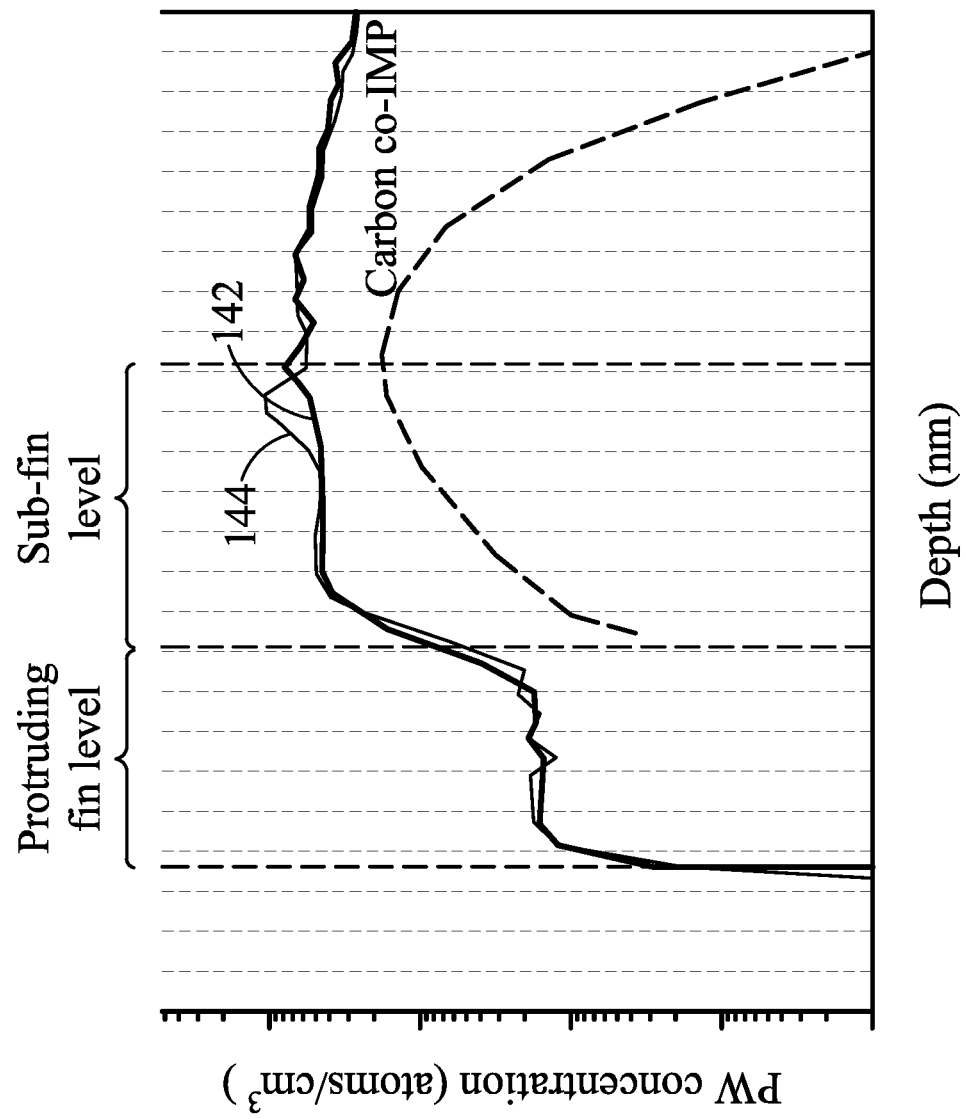

FIGS. 18 and 19 illustrate the experiment results revealing the effect of the co-implantation process. Samples having the structure similar to what is shown in FIG. 8 are measured. In FIGS. 18 and 19, p-well (PW) concentrations are illustrated as the functions the depth into wafer 10. The levels of protruding fins 58 and the levels of sub-fins 60 in FIG. 8 are also marked in FIGS. 18 and 19. The p-type dopant concentrations in the samples are measured using Secondary Ion Mass Spectrometry (SIMS). The dopant concentrations reflect the averaged-out dopant concentrations at different depths, with the dopant (boron) in STI regions 56 (FIG. 8) and the dopant in sub-fins 60 being averaged, and the average dopant concentration is shown as the dopant concentration at sub-fin level. The dopant concentration in protruding fins 58 is shown as the dopant concentration at protruding fin level.

FIG. 18 illustrates the SIMS result obtained from a sample similar to what is shown in FIG. 8, except no co-implantation is performed. Line 132 represents the p-well dopant (boron) concentration obtained through SIMS. Line 142 is obtained from the sample having a structure similar to that in FIG. 8, except STI regions 56 have been removed. Accordingly, the p-well dopant diffused into STI regions 56 is also removed along with STI regions 56, and the corresponding dopant concentration is illustrated as line 134. As a comparison, line 132 reflects that the p-well dopant diffused into STI regions 56 is also detected. It is observed that the portions of line 134 in the sub-fin level have lower boron concentrations than line 132. This indicates that the boron in sub-fins 60 is diffused into STI regions 56.

FIG. 19 illustrates the SIMS result obtained from a sample in which co-implantation is performed. The sample has the structure shown in FIG. 8. Line 142 represents the boron concentration obtained through SIMS. Line 144 is obtained from the sample having a structure similar to that in FIG. 8, except STI regions 56 have been etched. Accordingly, any of the p-well dopant diffused into STI regions 56 is also removed along with STI regions 56, which results are revealed as line 144. As a comparison, line 142 reflects that the boron diffused into STI regions 56 are also detected. The portions of line 144 in the sub-fin level have the same boron concentration as line 142. This indicates that substantially no boron is removed when STI regions 56 are removed, which means that with the co-implantation, no significant portion of boron is diffused from sub-fins 60 into STI regions 56.

FIG. 19 also illustrates the example distribution of carbon. In accordance with some embodiments of the present disclosure, carbon extends into sub-fins 60, and may extend below sub-fins 60 (below STI regions 56). The highest concentration of carbon may be close to the bottoms of sub-fins 60. Carbon may or may not extend into the protruding fins 58.

The embodiments of the present disclosure have some advantageous features. Through the co-implantation, the p-well dopant diffusion into STI regions is reduced or substantially eliminated. The inter-diffusion between p-well dopants and n-well dopants may also be reduced. By adjusting the position of the co-implantation, the dopant profile in the well regions and sub-fins may be controlled effectively.

In accordance with some embodiments of the present disclosure, a method of forming a semiconductor device includes performing a first implantation process on a semiconductor substrate to form a deep p-well region; performing a second implantation process on the semiconductor substrate with a diffusion-retarding element to form a co-implantation region; performing a third implantation process on the semiconductor substrate to form a shallow p-well region over the deep p-well region, wherein the co-implantation region is spaced apart from a top surface of the semiconductor substrate by a portion of the shallow p-well region, and the dee p-well region and the shallow p-well region are joined with each other; and forming an n-type FinFET, with the deep p-well region and the shallow p-well region acting as a well region of the n-type FinFET. In an embodiment, in the second implantation process, carbon is implanted. In an embodiment, the method further comprises implanting the semiconductor substrate to form an n-well region joining the deep p-well region and the shallow p-well region. In an embodiment, the second implantation process comprises a tilted implantation, and the co-implantation region extends into the n-well region. In an embodiment, the method further comprises etching the semiconductor substrate to form a first trench and a second trench extending into the semiconductor substrate, wherein a portion of the deep p-well region and a portion of the shallow p-well region are between the first trench and the second trench, and wherein bottoms of the first trench and the second trench are lower than a bottom of the co-implantation region. In an embodiment, the method further comprises filling the first trench and the second trench to form a first isolation region and a second isolation region, respectively; and recessing the first isolation region and the second isolation region. In an embodiment, top surfaces of the first isolation region and the second isolation region are substantially level with a top surface of the co-implantation region. In an embodiment, top surfaces of the first isolation region and the second isolation region are lower than a top surface of the co-implantation region. In an embodiment, the method further comprises implanting the semiconductor substrate to form an anti-punch-through region in the co-implantation region.

In accordance with some embodiments of the present disclosure, a method of forming a semiconductor device includes forming a first implantation mask over a semiconductor substrate; performing a first implantation process on the semiconductor substrate to form a p-well region, wherein the first implantation process is performed through the first implantation mask; performing a second implantation process on the semiconductor substrate to form a co-implantation region, wherein carbon is implanted through the first implantation mask; removing the first implantation mask; forming a second implantation mask over the semiconductor substrate; performing a third implantation process on the semiconductor substrate to form an n-well region joining the p-well region, wherein the third implantation process is performed through the second implantation mask; and forming an n-type FinFET and a p-type FinFET based on the p-well region and the n-well region, respectively. In an embodiment, the second implantation process comprises a tilt implantation through the first implantation mask. In an embodiment, the second implantation process further comprises a rotational implantation in addition to the tilt implantation. In an embodiment, the method further comprises etching the semiconductor substrate to form a first trench and a second trench extending into the semiconductor substrate, wherein a portion of the p-well region is between the first trench and the second trench, and wherein bottoms of the first trench and the second trench are lower than a bottom of the co-implantation region. In an embodiment, the method further comprises filling the first trench and the second trench to form a first isolation region and a second isolation region, respectively; and recessing the first isolation region and the second isolation region, wherein the n-type FinFET and the p-type FinFET are formed based on top portions of the p-well region and the n-well region, and the top portions of the p-well region and the n-well region are higher than top surfaces of the first isolation region and the second isolation region. In an embodiment, the method further comprises implanting the semiconductor substrate to form an anti-punch-through region in the co-implantation region.

In accordance with some embodiments of the present disclosure, a semiconductor device includes a bulk semiconductor substrate; a first isolation region and a second isolation region overlapping the bulk semiconductor substrate; a sub-fin between and contacting edges of the first isolation region and the second isolation region; a protruding fin overlapping the sub-fin, wherein the protruding fin is higher than top surfaces of the first isolation region and the second isolation region, and the protruding fin is formed of a semiconductor material; a p-well region extending into the sub-fin and the protruding fin; and a co-implantation region having a portion in the sub-fin. In an embodiment, a top surface of the co-implantation region is substantially at an interface between the sub-fin and the protruding fin. In an embodiment, a bottom surface of the co-implantation region is substantially at a same level as bottom surfaces of the first isolation region and the second isolation region. In an embodiment, a bottom surface of the co-implantation region is lower than bottom surfaces of the first isolation region and the second isolation region, and the semiconductor device further comprises an n-well region having a bottom portion contacting a bottom portion of the p-well region, wherein the co-implantation region further extends into the bottom portion of the n-well region. In an embodiment, the semiconductor device further comprises an anti-punch-through region in the co-implantation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
forming a p-well region in a semiconductor substrate;
doping carbon into the p-well region to form a co-implantation region;
etching the p-well region and the co-implantation region to form a semiconductor strip;
forming isolation regions on opposing sides of the semiconductor strip, wherein a top portion of the semiconductor strip protrudes higher than top surfaces of the isolation regions to form a semiconductor fin; and
forming an n-type Fin Field-Effect Transistor (FinFET) based on the semiconductor fin, with the p-well region acting as a well region of the n-type FinFET.

2. The method of claim 1, wherein the forming the p-well region comprises:
performing a first implantation process on the semiconductor substrate to form a deep p-well region, wherein the deep p-well region extends deeper into the semiconductor substrate than the co-implantation region; and
performing a second implantation process on the semiconductor substrate to form a shallow p-well region, wherein the co-implantation region extends deeper into the semiconductor substrate than the shallow p-well region.

3. The method of claim 1, wherein the co-implantation region and the p-well region are implanted using a same implantation mask.

4. The method of claim 1, wherein the co-implantation region and the p-well region are implanted using different implantation masks.

5. The method of claim 1, wherein the co-implantation region is formed through tilt implantation processes, and wherein the p-well region is formed through vertical implantation processes.

6. The method of claim 1, wherein the co-implantation region extends deeper into the semiconductor substrate than the isolation regions.

7. The method of claim 1 further comprising implanting the semiconductor substrate to form an n-well region on a side of, and joining, the p-well region.

8. The method of claim 7 further comprising forming a p-type transistor based on the n-well region, wherein the forming the p-type transistor is free from steps for forming co-implantation regions.

9. The method of claim 1, wherein the forming the isolation regions comprises:
etching the semiconductor substrate to form a first trench and a second trench extending into the semiconductor substrate, wherein a portion of the p-well region is between the first trench and the second trench, and wherein bottoms of the first trench and the second trench are lower than the co-implantation region.

10. The method of claim 9 further comprising:
filling the first trench and the second trench to form the isolation regions; and
recessing the isolation regions.

11. The method of claim 1, wherein top surfaces of the isolation regions are substantially level with a top end of the co-implantation region.

12. The method of claim 1, wherein top surfaces of the isolation regions are lower than a top end of the co-implantation region.

13. The method of claim 1, wherein top surfaces of the isolation regions are higher than a top end of the co-implantation region.

14. The method of claim 1 further comprising implanting the semiconductor substrate to form a p-type anti-punchthrough region, wherein the p-type anti-punch-through region is embedded in the co-implantation region.

15. A method comprising:
forming a p-well region in a semiconductor substrate;
doping carbon into the p-well region to form a co-implantation region, wherein the p-well region and the co-implantation region are formed by implantation processes using a same implantation mask;
etching the p-well region and the co-implantation region to form a semiconductor strip;
forming isolation regions on opposing sides of the semiconductor strip, wherein a top portion of the semiconductor strip protrudes higher than top surfaces of the isolation regions to form a semiconductor fin; and
forming an n-type Fin Field-Effect Transistor (FinFET) based on the semiconductor fin, with the p-well region acting as a well region of the n-type FinFET.

16. The method of claim 15, wherein the co-implantation region is formed through tilt implantation processes, and wherein the p-well region is formed through vertical implantation processes.

17. The method of claim 15 further comprising:
implanting the semiconductor substrate to form an n-well region on a side of, and joining, the p-well region; and
forming a p-type transistor based on the n-well region, wherein the forming the p-type transistor is free from steps for forming co-implantation regions.

18. A method comprising:
forming a p-well region in a semiconductor substrate;
doping carbon into the p-well region to form a co-implantation region;
implanting the semiconductor substrate to form a p-type anti-punch-through region, wherein the p-type anti-punch-through region is embedded in the co-implantation region;
etching the p-well region and the co-implantation region to form a semiconductor strip;
forming isolation regions on opposing sides of the semiconductor strip, wherein a top portion of the semiconductor strip protrudes higher than top surfaces of the isolation regions to form a semiconductor fin; and
forming an n-type Fin Field-Effect Transistor (FinFET) based on the semiconductor fin, with the p-well region acting as a well region of the n-type FinFET.

19. The method of claim 18, wherein the forming the isolation regions comprises:
etching the semiconductor substrate to form a first trench and a second trench extending into the semiconductor substrate, wherein a portion of the p-well region is between the first trench and the second trench, and wherein bottoms of the first trench and the second trench are lower than the co-implantation region;
filling the first trench and the second trench to form the isolation regions; and
recessing the isolation regions.

20. The method of claim 19, wherein after the isolation regions are recessed, top surfaces of the isolation regions are substantially level with a top end of the co-implantation region.

* * * * *